(12) United States Patent
Kwak et al.

(10) Patent No.: US 8,071,406 B2
(45) Date of Patent: Dec. 6, 2011

(54) ARRAY SUBSTRATE AND METHOD OF MANUFACTURING THE SAME

(75) Inventors: Sang-Ki Kwak, Cheonan-si (KR); Min Kang, Seoul (KR); Se-Ah Kwon, Seoul (KR); Hyang-Shik Kong, Seongnam-si (KR); Byung-Duk Yang, Yongin-si (KR); Sang-Hun Lee, Suwon-si (KR); Gwan-Soo Kim, Cheonan-si (KR); Yui-Ku Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 214 days.

(21) Appl. No.: 12/425,744

(22) Filed: Apr. 17, 2009

(65) Prior Publication Data

US 2010/0065850 A1    Mar. 18, 2010

(30) Foreign Application Priority Data

Sep. 17, 2008   (KR) .................. 10-2008-0090893

(51) Int. Cl.
*H01L 21/00* (2006.01)
(52) U.S. Cl. ............... 438/34; 257/91; 257/E33.077; 257/E21.033
(58) Field of Classification Search .......... 257/91, 257/E33.077, E33.06, E21.033; 438/34; 349/44
See application file for complete search history.

(56) References Cited

U.S. PATENT DOCUMENTS

| | | | |
|---|---|---|---|
| 6,749,975 B2 * | 6/2004 | Cheng et al. | 430/7 |
| 2005/0117082 A1 * | 6/2005 | Tanaka et al. | 349/44 |
| 2009/0268117 A1 * | 10/2009 | Yamazaki et al. | 349/44 |

FOREIGN PATENT DOCUMENTS

| | | |
|---|---|---|
| KR | 1020060086644 | 8/2006 |
| KR | 1020070035145 | 3/2007 |
| KR | 1020080032852 | 4/2008 |

* cited by examiner

*Primary Examiner* — Caridad Everhart
(74) *Attorney, Agent, or Firm* — F. Chau & Associates, LLC

(57) ABSTRACT

An array substrate includes a substrate including a display area and a peripheral area surrounding the display area, a transistor layer formed in the display area of the substrate and electrically connected to a gate line and a data line, a color filter formed in a pixel region on the transistor layer, a first light blocking member disposed between adjacent color filters, a first transparent member formed on the first light blocking member to cover the first light blocking member, a first color pattern formed in a peripheral area of the substrate and including substantially the same material as the color filter, and a second transparent member including substantially the same material as the first transparent member. The second transparent member is disposed in the peripheral area of the substrate to cover the first color pattern.

20 Claims, 19 Drawing Sheets

ARRAY SUBSTRATE AND METHOD OF MANUFACTURING THE SAME

CROSS-REFERENCE TO RELATED APPLICATION

The present application claims priority under 35 U.S.C. §119 to Korean Patent Application No. 2008-90893, filed on Sep. 17, 2008, the disclosure of which is incorporated herein by reference.

BACKGROUND OF THE INVENTION

1. Technical Field

The present disclosure relates to an array substrate and method of manufacturing an array substrate, and more particularly, to an array substrate having an enhanced display quality.

2. Discussion of the Related Art

A liquid crystal display (LCD) device, which is one of the flat panel display devices, includes an array substrate, an opposite substrate facing the array substrate and a liquid crystal layer interposed between the array substrate and the opposite substrate.

Color-filter On Array (COA) technology for forming a color filter on the array substrate may be used to enhance transmittance of the LCD device.

In order to employ the COA technology on the array substrate, a thin film transistor (TFT) layer including a TFT is formed on a substrate, a color photo-resist layer is formed on the TFT layer, and a color filter is formed in a pixel area by patterning the color photo-resist layer. A pixel electrode is formed and is electrically connected to the TFT that is formed in the pixel area where the color filter is formed so that a COA substrate is formed. The opposite substrate facing the COA substrate includes a common electrode facing the pixel electrode and a light blocking member.

When the COA substrate is combined with the opposite substrate where the light blocking member is formed, misalignment may occur. Therefore, Black matrix On Array (BOA) Technology for forming the light blocking member on the COA substrate has been developed to prevent misalignment.

However, since the color filter, the light blocking member and a column spacer are formed on the COA substrate, the COA substrate may be uneven so that filling of the liquid crystal layer may not be performed to acceptable standards. In addition, since a gas generated from the light blocking pattern flows into the liquid crystal layer, an afterimage may occur.

SUMMARY OF THE INVENTION

Exemplary embodiments of the present invention provide an array substrate having an enhanced display quality and a method of manufacturing the same.

According to an exemplary embodiment of the present invention, an array substrate includes a substrate including a display area and a peripheral area surrounding the display area, a transistor layer formed in the display area of the substrate and electrically connected to a gate line and a data line, a color filter formed in a pixel region on the transistor layer, a first light blocking member disposed between adjacent color filters, a first transparent member formed on the first light blocking member to cover the first light blocking member, a first color pattern formed in a peripheral area of the substrate and including substantially the same material as the color filter, and a second transparent member including substantially the same material as the first transparent member. The second transparent member is disposed in the peripheral area of the substrate to cover the first color pattern.

The array substrate further includes a spacing part maintaining a gap between the substrate and an opposite substrate. The spacing part includes a greater thickness than each of the first and second transparent members. The spacing part further includes substantially the same material as the color filter.

The array substrate further includes a second color pattern having substantially the same material as the color filter. The second color pattern is disposed between the substrate and the color filter.

The spacing part includes a light blocking pattern having substantially the same material as the first light blocking member, and the light blocking pattern is disposed between the color filter and a transparent pattern.

The array substrate further includes a circuit layer formed in the peripheral area. The circuit layer includes a metal pattern of a circuit part.

The array substrate further includes a second light blocking member disposed between the first color pattern and the second transparent member, wherein the second light blocking member comprises an opening area corresponding to the metal pattern, and a contact electrode of the circuit part is in contact with the metal pattern through the opening area. The contact electrode is in contact with the second transparent member.

The circuit part includes a gate driving circuit applying a driving signal to the gate line.

The first transparent member may be extended towards an upper surface of the first and second color filters to cover the upper surface of the first and second color filters.

According to an exemplary embodiment of the present invention, an array substrate includes a substrate having a display area and a peripheral area surrounding the display area, a transistor layer formed in the display area of the substrate and electrically connected to a gate line and a data line, a color filter formed in a pixel region on the transistor layer, a first light blocking member disposed between adjacent color filters, a spacing part maintaining a gap between the substrate and an opposite substrate, a second color pattern formed in the peripheral area and including substantially the same material as the color filter, a circuit part including a metal pattern formed in the peripheral area and a contact electrode contacting the metal pattern and a second light blocking member formed on the second color pattern. The spacing part includes a light blocking pattern having substantially the same material as the first light blocking member and a first color pattern having substantially the same material as the color filter.

According to an exemplary embodiment of the present invention, an array substrate includes a substrate having a display area and a peripheral area surrounding the display area, a transistor layer formed in the display area of the substrate and having a gate metal pattern and a data metal pattern, a color filter formed in a pixel region on the transistor layer, a first light blocking member disposed between adjacent color filters, a spacing part maintaining a gap between the substrate and an opposite substrate and having substantially the same material as the color filter, a color pattern formed in the peripheral area and having substantially the same material as the color filter, a circuit part having a metal pattern formed in the peripheral area and a contact electrode contacting the metal pattern, and a second light blocking member formed on the color pattern. The spacing part is disposed in an area where the gate metal pattern is overlapped with the data metal pattern.

According to an exemplary embodiment of the present invention, a method of manufacturing an array substrate includes forming a substrate having a display area and a peripheral area surrounding the display area, forming a transistor layer in the display area of the substrate and a circuit layer having a metal pattern of a circuit part in the peripheral area of the substrate, forming a color filter on the transistor layer and a first color pattern on the circuit layer, forming a first light blocking member between adjacent color filters and a second light blocking member in the peripheral area to cover the first color pattern, forming a pixel electrode on the color filter and a contact electrode contacting the metal pattern, and forming a first transparent member and a second transparent member on the substrate having the pixel electrode and the contact electrode.

Forming the first color pattern further includes forming a second color pattern on the color filter.

Forming the second transparent member further includes forming a transparent pattern on the second color pattern. The transparent pattern includes a greater thickness than the second transparent member.

Forming the second transparent member further includes forming a transparent pattern having a greater thickness than the second transparent member.

Forming the second light blocking member further includes forming a light blocking pattern on the color filter.

According to an exemplary embodiment of the present invention, a method of manufacturing an array substrate is provided as follows. A substrate including a display area and a peripheral area surrounding the display area is formed. A transistor layer in the display area of the substrate and a circuit layer including a metal pattern of a circuit part in the peripheral area of the substrate are formed. A first color filter and a second color filter are formed on the transistor layer, and a first color pattern is formed on the circuit layer. A first light blocking member is formed between the first color filter and the second color filter. A second light blocking member is formed in the peripheral area to cover the first color pattern. A first transparent member and a second transparent member are formed on the substrate having the first and second light blocking members. A pixel electrode is formed on the first transparent member and a contact electrode is formed on the second transparent member. The contact electrode contacts the metal pattern.

The first transparent member may be extended to an upper surface of the first and second color filters.

According to an exemplary embodiment of the present invention, a method of manufacturing an array substrate includes forming a substrate having a display area and a peripheral area surrounding the display area, forming a transistor layer in the display area of the substrate and a circuit layer having a metal pattern of a circuit part in the peripheral area of the substrate, forming a color filter on the transistor layer and a color pattern on the circuit layer, forming a pixel electrode on the color filter and a contact electrode contacting the metal pattern, and forming a first light blocking member between adjacent color filters, a light blocking pattern on the color filter corresponding to a region where the gate metal pattern is overlapped with the data metal pattern, and a second light blocking member in the peripheral area to cover the color pattern.

BRIEF DESCRIPTION OF THE DRAWINGS

Exemplary embodiments of the present invention can be understood in more detail from the following descriptions taken in conjunction with the accompanying drawings, in which.

DESCRIPTION OF THE EXEMPLARY EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein.

Figure 1A:
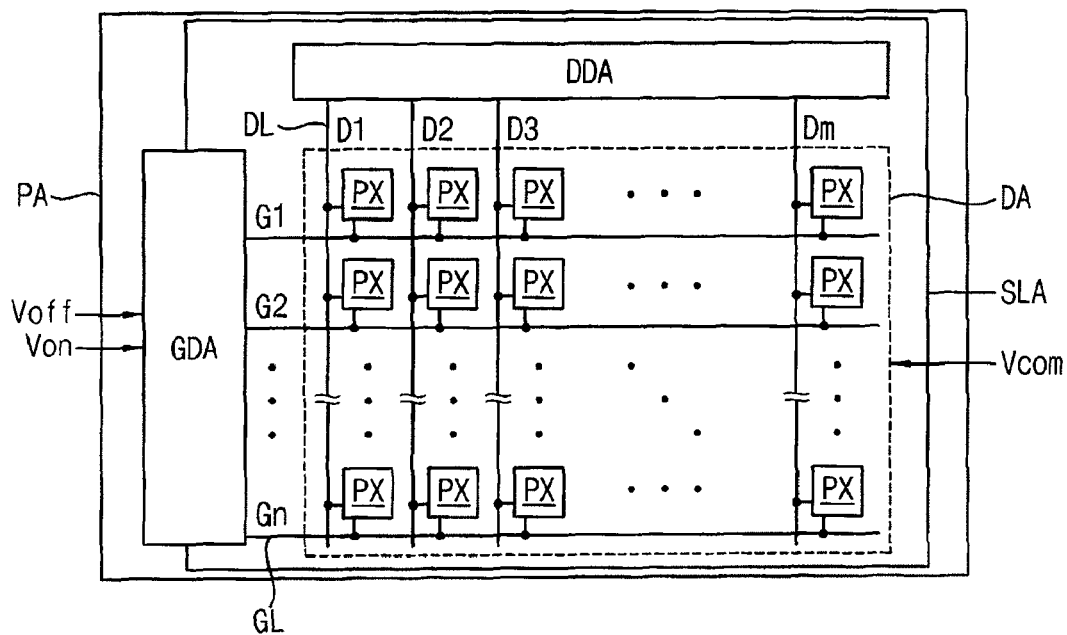
FIG. 1A is a plan view of an array substrate according to an exemplary embodiment of the present invention.
Figure 1B:
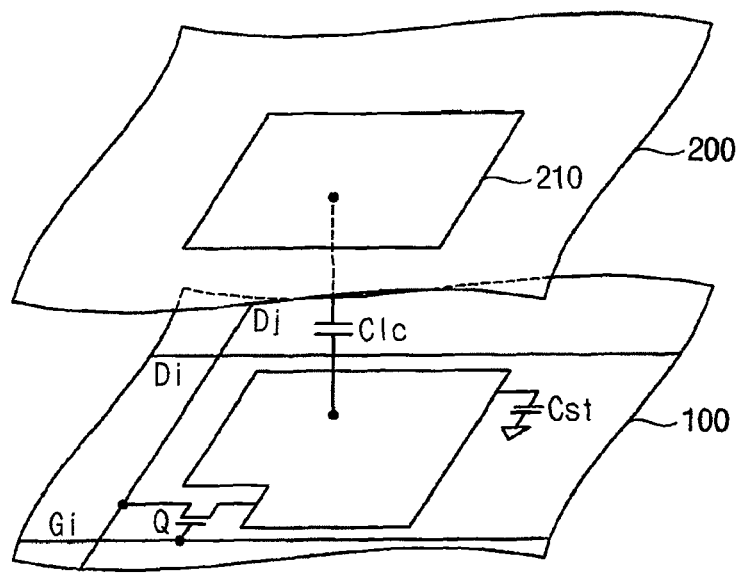
FIG. 1B is a perspective view schematically showing a display panel according to an exemplary embodiment of the present invention.

FIG. 1A is a plan view of an array substrate according to an exemplary embodiment of the present invention. FIG. 1B is a perspective view schematically showing a display panel according to an exemplary embodiment of the present invention.

Referring to FIGS. 1A and 1B, a display panel includes a display substrate 100a, an opposite substrate 200 facing the display substrate 100a and a liquid crystal layer (not shown) interposed between the display substrate 100a and the opposite substrate 200.

The display substrate 100a includes a display area (DA) and a peripheral area (PA) surrounding the display area DA. A plurality of gate lines (GL) and a plurality of data lines (DL) crossing the gate lines are formed in the display area DA. A plurality of pixel electrodes are formed in the display area DA.

The peripheral area PA includes a data driving area (DDA), a gate driving area (GDA) and a seal line area (SLA).

The data driving area DDA includes input pads receiving driving signals of the display panel and output pads outputting data signals to the data lines.

The gate driving area GDA includes a gate driving circuit generating gate signals that are applied to the gate lines.

The seal line area SLA includes a sealant to combine the display substrate 100a with the opposite substrate 200. In an exemplary embodiment, the seal line area SLA overlaps the gate driving area GDA.

Since the sealant is disposed between the gate driving circuit and a common electrode formed on the opposite substrate 200, capacitance generated by the gate driving circuit and the common electrode can be reduced.

Figure 2:
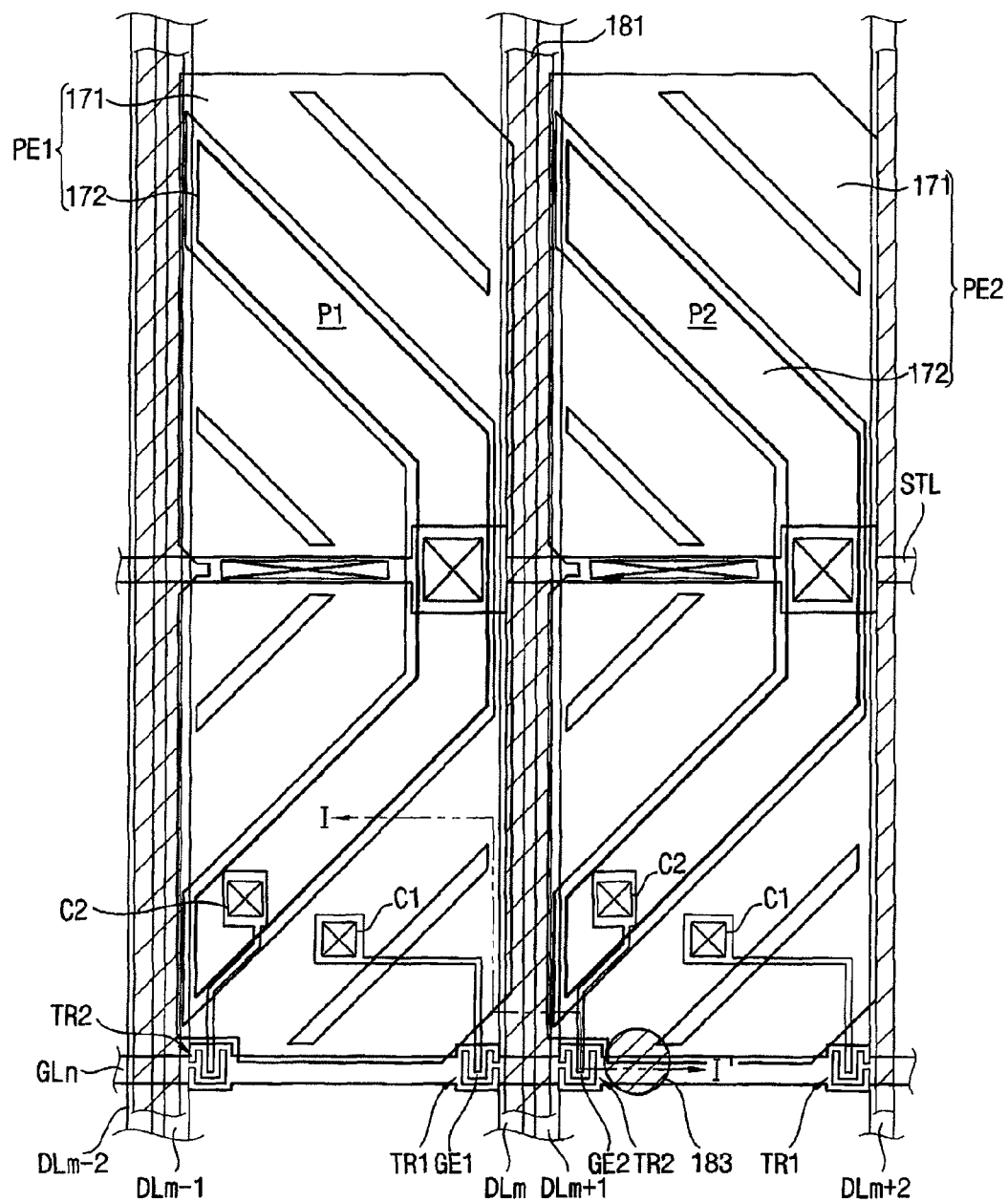
FIG. 2 is an enlarged plan view of a display panel of FIG. 1.
Figure 3:
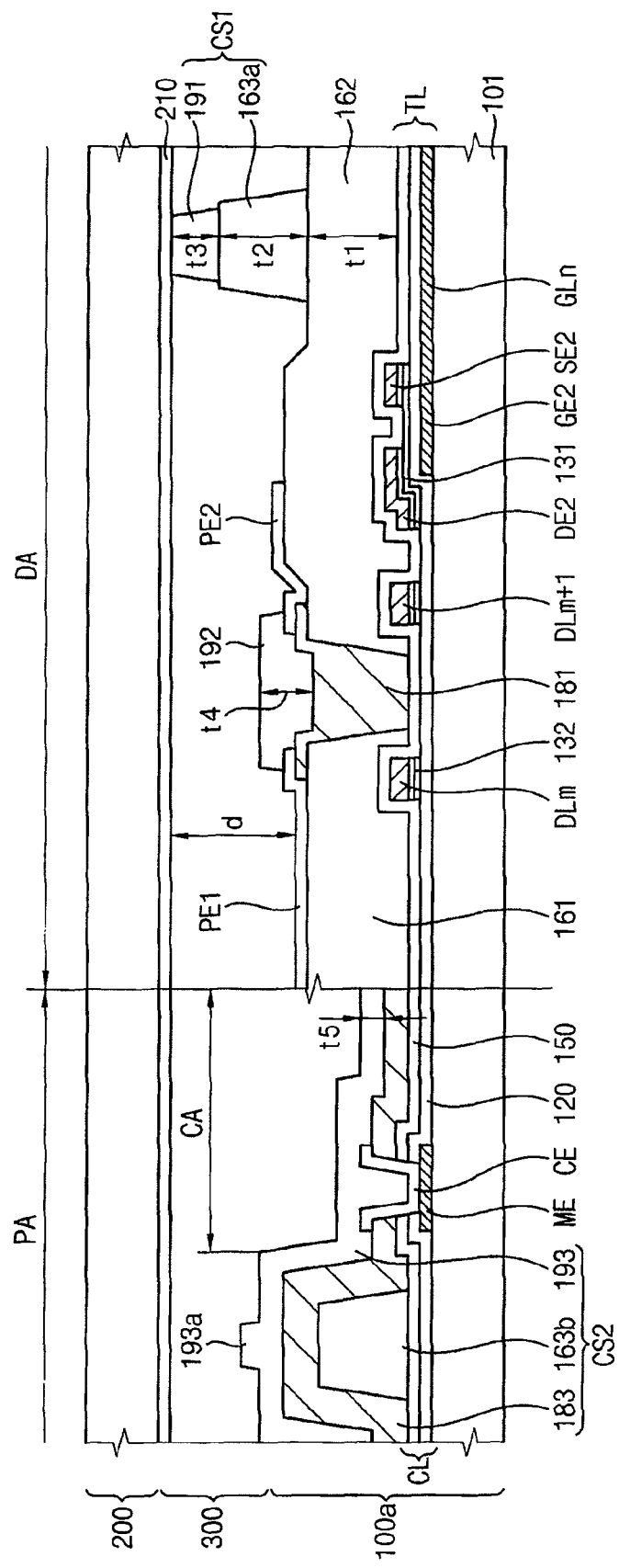
FIG. 3 is a cross-sectional view of a display panel taken along a line 'I-I' of FIG. 2.

FIG. 2 is an enlarged plan view of a display panel of FIG. 1. FIG. 3 is a cross-sectional view taken along a line 'I-I'' of FIG. 2.

Referring to FIGS. 1 to 3, the display panel includes the display substrate 100a, the opposite substrate 200 and a liquid crystal layer 300. The opposite substrate 200 includes a common electrode 210.

The display substrate 100a includes a first base substrate 101. The first base substrate 101 includes the display area DA and the peripheral area PA surrounding the display area DA.

The display area DA includes a transistor layer (TL), color filters 161, 162, pixel electrodes PE1, PE2, a first light blocking member 181, a spacing part CS1 and a first transparent member 192.

The transistor layer TL includes a gate metal pattern formed on the first base substrate 101, a gate insulation layer 120, channel patterns 131, 132, a source metal pattern and a passivation layer 150. The gate metal pattern includes a plurality of gate lines GL, gate electrodes GE1, GE2 and a storage line STL. The n-th gate line GLn is extended in a first direction. The n-th gate line GLn includes the first gate electrode GE1 of a first transistor TR1 and the second gate electrode GE2 of a second transistor TR2. The storage line STL is formed in parallel with the n-th gate line GLn.

The gate insulation layer 120 is formed on the gate metal pattern. The channel patterns 131, 132 are formed to correspond to the source metal pattern.

In an exemplary embodiment, the first channel pattern 131 is formed on the gate electrodes GE1, GE2 to correspond to source and drain electrodes SE1, SE2, DE1, DE2, and the second channel pattern 132 is formed to correspond to the data lines DLm−2, DLm−1, DLm, DLm+1, DLm+2. The channel patterns 131, 132 include an active layer and an ohmic contact layer.

The source metal pattern includes a plurality of data lines DLm−2, DLm−1, DLm, DLm+1, DLm+2, the source electrodes SE1, SE2 and the drain electrodes DE1, DE2. The data lines DLm−2, DLm−1, DLm, DLm+1, DLm+2 are formed in a second direction that crosses the first direction in which the gate lines extend. The source electrodes SE1, SE2 extend from the data lines DLm−2, DLm−1, DLm, DLm+1, DLm+2. The source electrodes SE1, SE2 overlap the gate electrodes GE1, GE2.

The drain electrodes DE1, DE2 are spaced apart from the source electrode SE1, SE2 and overlap the gate electrodes GE1, GE2. The drain electrodes DE1, DE2 are connected to the pixel electrodes PE1, PE2 through a first contact hole C1 and a second contact hole C2, respectively.

The passivation layer 150 is formed on the first base substrate 101 where the source metal pattern is formed. The passivation layer 150 protects the exposed channel pattern 131 and the source metal patterns of the first and second transistors TR1, TR2.

The color filters 161, 162 are formed in the pixel areas P1, P2 of the first base substrate 101 where the transistor layer TL is formed. The color filter 161 includes a first color, and the color filter 162 includes a second color that is different from the first color. A boundary area of the color filters 161, 162 includes a first opening area H1 to expose the passivation layer 150. In an exemplary embodiment, portions of the color filters 161, 162 that are formed between the m-th data line DLm and the n+1-th data line DLm+1 are removed so that the first opening area H1 is formed. The color filters 161, 162 may further include opening areas that correspond to the first and second contact holes C1, C2 and the storage line STL.

The pixel electrodes PE1, PE2 are formed in the pixel area P1, P2. The pixel electrodes PE1, PE2 include a first sub electrode 171 and a second sub electrode 172 to divide a domain for arranging liquid crystal molecules. The first sub electrode 171 and the second sub electrode 172 can be patterned in a chevron shape. The first sub electrode 171 is electrically connected to the drain electrode DE1 of the first transistor TR1 through the first contact hole C1. The second sub electrode 172 is electrically connected to the drain electrode DE2 of the second transistor TR2 through the second contact hole C2.

The first light blocking member 181 is formed in the first opening area H1. The first light blocking member 181 divides the pixel areas P1, P2 where the color filters 161, 162 are formed. The first light blocking member 181 includes a material that can block light.

The spacing part CS1 maintains a cell gap (d) between the display substrate 100a and the opposite substrate 200. The spacing part CS1 is formed on the color filter 162 corresponding to the n-th gate line GLn. The spacing part CS1 can be disposed in an area corresponding to the gate metal pattern or the source metal pattern.

The spacing part CS1 includes a first color pattern 163a formed on the color filter 162 and a transparent pattern 191 formed on the first color pattern 163a. The first color pattern 163a includes a third color that is different from the second color of the color filter 162. The first color pattern 163a is formed of substantially the same material as the color filters 161, 162.

The cell gap d depends on a first thickness (t1) of the color filter 162, a second thickness (t2) of the first color pattern 163a and a third thickness (t3) of the transparent pattern 191. In an exemplary embodiment, when the cell gap d is about 4 μm, the first thickness t1 of the color filter 162 is about 3 μm, the second thickness t2 of the first color pattern 163a is about 3 μm and the third thickness t3 of the transparent pattern 191 is about 1 μm.

The first transparent member 192 is formed on the first light blocking member 181 to cover the first light blocking member 181. The first transparent member 192 includes substantially the same material as the transparent pattern 191. A fourth thickness t4 of the first transparent member 192 is thinner than the third thickness t3 of the transparent pattern 191. In an exemplary embodiment, the fourth thickness t4 of the first transparent member 192 is not more than about 1 μm.

When the fourth thickness t4 of the first transparent member 192 is thinner, a height difference between the first transparent member 192 and the color filters 161, 162 can be reduced so that a spread property of the liquid crystal layer 300 can be improved. The spread property refers to a property which allows liquid crystals to move easily between the pixel electrode PE1 and the pixel electrode PE2. The first transparent member 192 covers the first light blocking member 181 so that a gas generated from the first light blocking member 181 is blocked by the first transparent member 192. Thus, an afterimage that may occur by the gas can be prevented.

The peripheral area PA includes a circuit layer CL, a second color pattern 163*b*, a second light blocking member 183, a contact electrode CE and a second transparent member 193.

The circuit layer CL includes a metal pattern (ME), the gate insulation layer 120 and the passivation layer 150 to form the gate driving circuit and an electrostatic prevention circuit. The metal pattern ME includes the gate metal pattern and the source metal pattern.

The second color pattern 163*b* is formed on the circuit layer CL of the peripheral area PA. The second color pattern 163*b* includes substantially the same material as the color filters 161, 162.

The second light blocking member 183 is formed in the peripheral area PA where the second color pattern 163*b* is formed. The second light blocking member 183 includes substantially the same material as the first light blocking member 181. The first and second light blocking members 181, 183 can be manufactured by a same manufacturing process. The second light blocking member 183 includes a second opening area H2 corresponding to the metal pattern ME. The metal pattern ME is electrically connected to the contact electrode CE through the second opening area H2.

The second transparent member 193 is formed on the second light blocking member 183 of the peripheral area PA. The second transparent member 193 includes a protrusion 193*a* formed in an area corresponding to the second color pattern 163*b*. The second transparent member 193 covers the second light blocking member 183 so that a gas generated from the second light blocking member 183 is blocked by the second transparent member 193. A fifth thickness t5 of the second transparent member 193 is thinner than the thickness t3 of the transparent pattern 191. In an exemplary embodiment, the fifth thickness t5 of the second transparent member 193 is not more than about 1 μm.

A protrusion part (CS2) is formed in the peripheral area PA. The protrusion part CS2 includes the second color pattern 163*b*, the second light blocking member 183 and the second transparent member 193. A thickness of the protrusion part CS2 is thinner than a combined thickness of the color filter 162, the first color pattern 163*a* and the transparent pattern 191. The protrusion part CS2 can reduce a volume of the liquid crystal layer 300 to be filled so that a filling property of the liquid crystal layer 300 can be improved.

FIGS. 4A to 4E are cross-sectional views showing a method of manufacturing a display panel of FIG. 3.

Figure 4A:
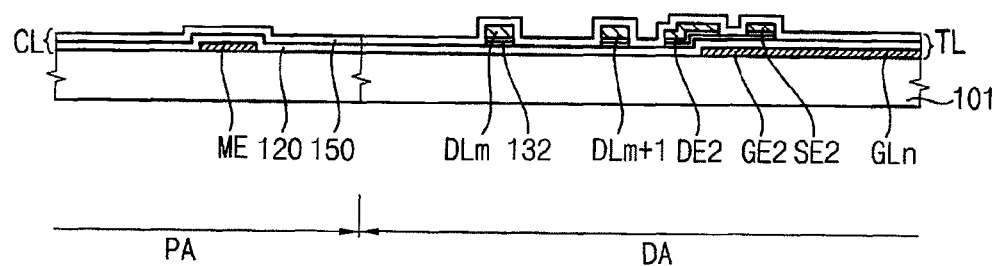
FIGS. 4A to 4E are cross-sectional views showing a method of manufacturing a display panel of FIG. 3.

Referring to FIGS. 2, 3 and 4A, the display area DA of the base substrate 101 includes the transistor layer TL, and the peripheral area PA of the base substrate 101 includes the circuit layer CL.

In an exemplary embodiment, a gate metal layer is formed on the base substrate 101. The gate metal pattern is formed by patterning the gate metal layer. The gate metal pattern includes the n-th gate line GLn, the gate electrodes GE1, GE2, the storage line STL and the metal pattern ME of the peripheral area PA. The gate insulation layer 120 is formed on the base substrate 101 where the gate metal pattern is formed.

A channel layer and a source metal layer are formed on the base substrate 101 where the gate insulation layer 120 is formed. The channel patterns 131, 132 may be formed on the gate insulation layer 120.

The source metal pattern includes the data lines DLm−1, DLm, the source electrodes SE1, SE2 and the drain electrodes DE1, DE2. The first channel pattern 131 is formed behind/under the source electrodes SE1, SE2 and the drain electrodes DE1, DE2. The second channel pattern 132 is formed behind/under the data lines DLm−1, DLm. The source metal pattern may further include a metal pattern for the gate driving circuit and the electrostatic prevention circuit in the peripheral area PA.

The passivation layer 150 is formed on the base substrate 101 where the source metal pattern is formed.

Figure 4B:
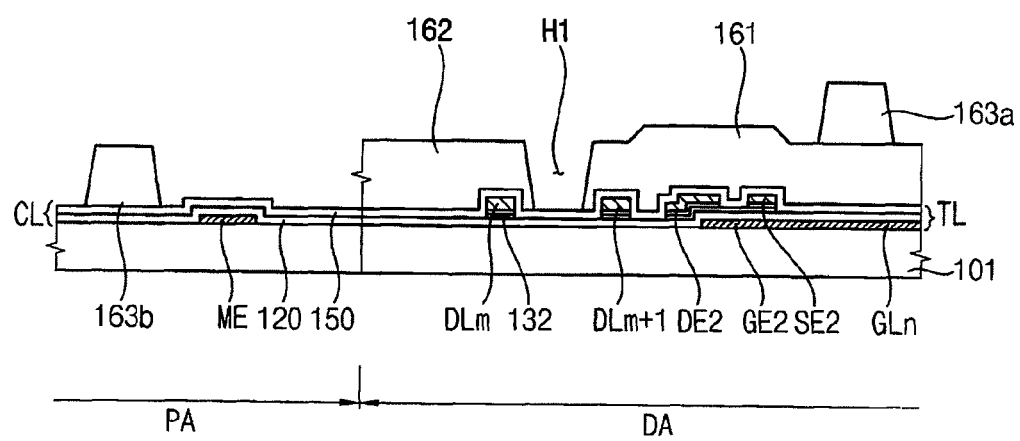

Referring to FIGS. 2, 3, and 4B, the color filters 161, 162, the first color pattern 163*a* and the second color pattern 163*b* are formed on the base substrate 101 where the transistor layer TL and the circuit layer CL are formed.

In an exemplary embodiment, the color filter 161 including the first color is formed in the first pixel area P1. The color filter 162 including the second color is formed in the second pixel area P2. A color photo-resist layer including a third color is formed and patterned. Then, the first color pattern 163*a* is formed in the display area DA, and the second color pattern 163*b* is formed in the peripheral area PA. The first opening area H1 is formed in the boundary area between the pixel areas P1, P2 where the color filters 161, 162 are formed. The opening area H1 is extended in parallel with an extended direction of the data lines DLm−1, DLm. The color filters 161, 162 may include opening areas to expose the passivation layer 150 corresponding to the first and second contact holes C1, C2.

Figure 4C:
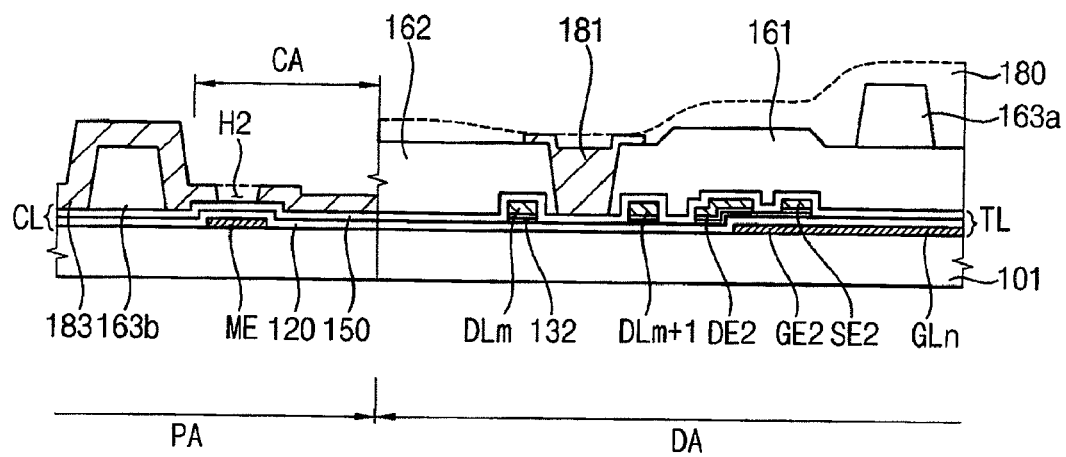

Referring to FIGS. 2, 3, and 4C, a light blocking layer 180 is formed on the base substrate 101 where the color filters 161, 162, the first color pattern 163*a* and the second color pattern 163*b* are formed. The first light blocking member 181 is formed in the display area DA and the second light blocking member 183 is formed in the peripheral area PA by patterning the light blocking layer 180. The light blocking layer 180 may have a thickness to form the first light blocking member 181 in the first opening area H1 of the display area DA.

The second light blocking member 183 includes the second opening area H2 corresponding to an area where the metal pattern ME and contact electrode CE are formed.

Figure 4D:
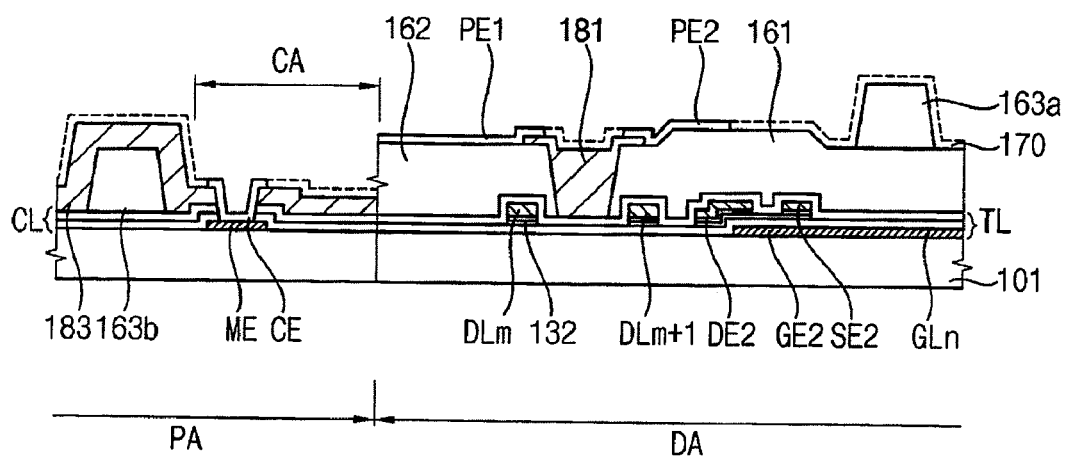

Referring to FIGS. 2, 3 and 4D, a transparent conductive layer 170 is formed on the base substrate 101 where the first and second light blocking members 181, 183 are formed. The transparent conductive layer 170 is patterned so that the pixel electrodes PE1, PE2 are formed in the display area DA and the contact electrode CE is formed in the peripheral area PA. The pixel electrodes PE1, PE2 are formed in the first and second pixel areas P1, P2, respectively. The contact electrode CE is connected to the metal pattern ME of the circuit area CA through the second opening area H2.

Figure 4E:
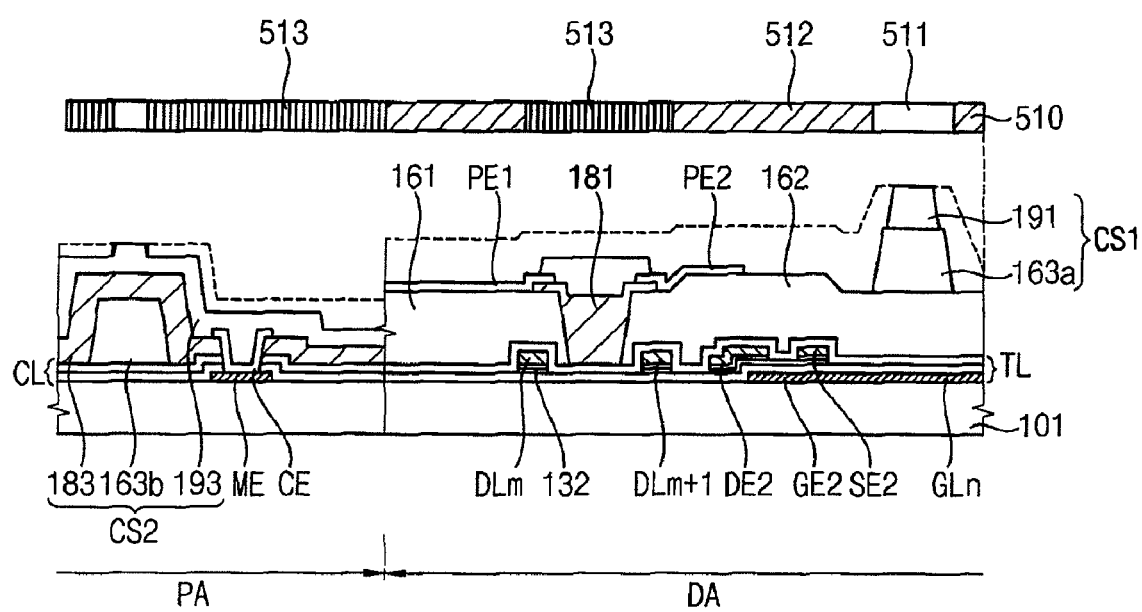

Referring to FIGS. 2, 3 and 4E, a covering layer 190 is formed on the base substrate 101 where the pixel electrodes PE1, PE2 and the contact electrode CE are formed. The covering layer 190 includes, for example, a transparent material. The transparent material may forms part or all of a spacing part in a liquid crystal display device. Since the covering layer 190 is formed on the first color pattern 163*a*, the covering layer 190 may have a thinner thickness due to the second thickness t2 of the first color pattern 163*a*. In an exemplary embodiment, when a thickness of the spacing part CS1 is about 4 μm, a thickness of the first color pattern 163*a* is about 3 μm so that a thickness of the transparent pattern 191 formed by the covering layer 190 is about 1 μm. When the spacing part CS1 is formed by the covering layer 190, the thickness of the transparent pattern 191 is about 4 μm.

The covering layer 190 is patterned by using a mask 510 including a transmissive portion 511, a light blocking portion 512 and a slit portion 513. The transmissive portion 511 corresponds to the first color pattern 163*a*, and the slit portion 513 corresponds to portions of the display and the peripheral areas DA, PA. The light blocking portion 512 corresponds to an area where the covering layer 190 is not formed. The transmissive portion 511 may be formed in an area corresponding to the second color pattern 163b.

The covering layer 190 includes the first transparent member 192 formed on the first light blocking member 181 and the second transparent member 193 in the peripheral area PA. The second transparent member 193 may further include the protrusion 193a corresponding to the second color pattern 163b.

The first and second transparent members 192, 193 patterned by the slit portion 513 may have thinner thicknesses than the thickness of the transparent pattern 191 patterned by the transmissive portion 511. Thus, since the thickness of the first transparent member 192 is thinner, a spread property of the liquid crystal layer 300 can be improved.

Figure 5:
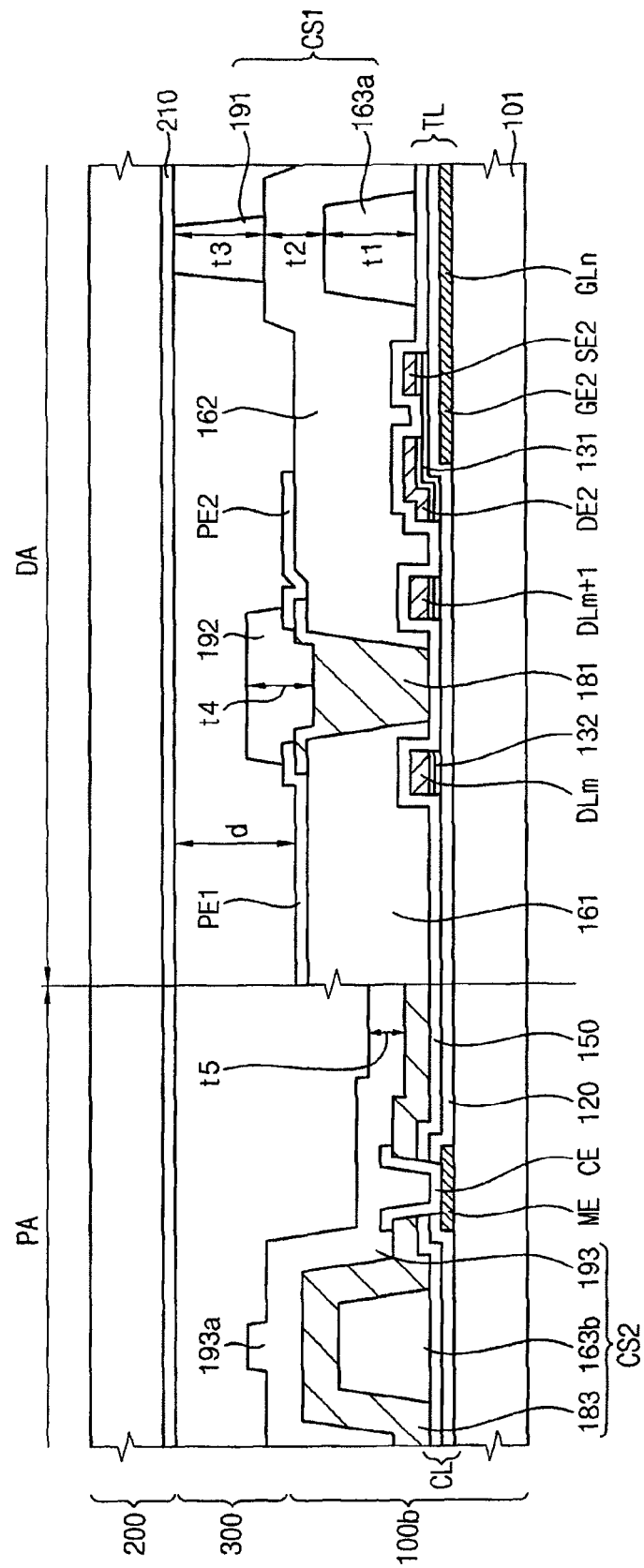
FIG. 5 is a cross-sectional view of a display panel according to an exemplary embodiment of the present invention.

FIG. 5 is a cross-sectional view of a display panel according to an exemplary embodiment of the present invention.

Referring to FIGS. 2 and 5, the display panel includes a display substrate 100b, the opposite substrate 200 and the liquid crystal layer 300.

The display substrate 100b includes the base substrate 101 having the display area DA and the peripheral area PA. The display area DA includes the transistor layer TL, the color filters 161, 162, the pixel electrodes PE1, PE2, the first light blocking member 181, the spacing part CS1 and the first transparent member 192. The peripheral area PA includes the circuit layer CL, the second color pattern 163b, the second light blocking member 183, the contact electrode CE and the second transparent member 193.

The spacing part CS1 includes the first color pattern 163a and the transparent pattern 191.

The first color pattern 163a is formed on the transistor layer TL and corresponds to the n-th gate line GLn. The color filter 162 is formed on the first color pattern 163a and corresponds to the gate metal pattern and the source metal pattern.

The transparent pattern 191 includes substantially the same material as the first and second transparent members 192, 193. The transparent pattern 191 is formed on the color filter 162 where the first color pattern 163a is formed. An end portion of the transparent pattern 191 is in contact with the opposite substrate 200 and to maintain the cell gap d of the liquid crystal layer 300.

The cell gap d includes part of a thickness t2 of the color filter 162 and a thickness t3 of the transparent pattern 191. In an exemplary embodiment, when the cell gap d is about 4 μm, the thickness t1 of the first color pattern 163a is about 3 μm, the thickness t2 of the color filter 162 formed on the first color pattern 163a is about 2 μm and the thickness t3 of the transparent pattern 191 is about 2-3 μm.

A thickness t4 of the first transparent member 192 and a thickness t5 of the second transparent member 193 are thinner than the thickness t3 of the transparent pattern 191. When the third thickness of the transparent pattern 191 is about 2 μm, the thickness t4 of the first transparent member 192 is not more than about 2 μm.

Figure 6A:
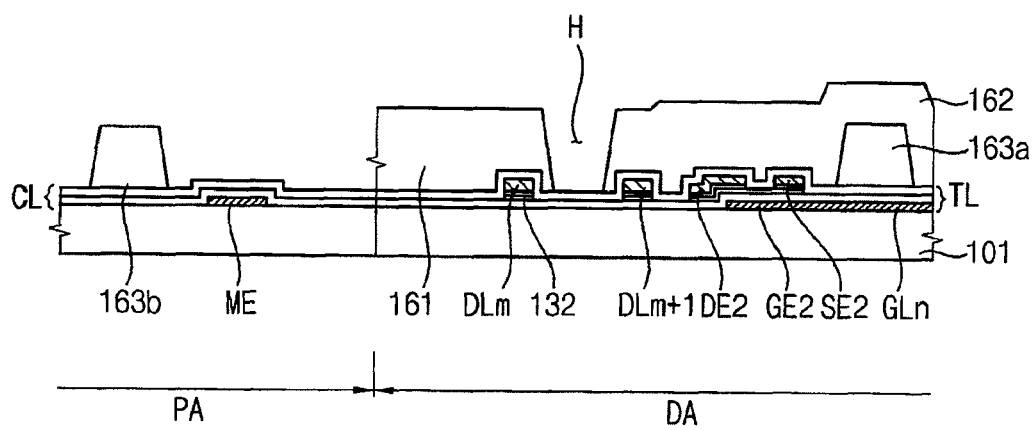
FIGS. 6A to 6C are cross-sectional views showing a method of manufacturing a display panel of FIG. 5.
Figure 6B:
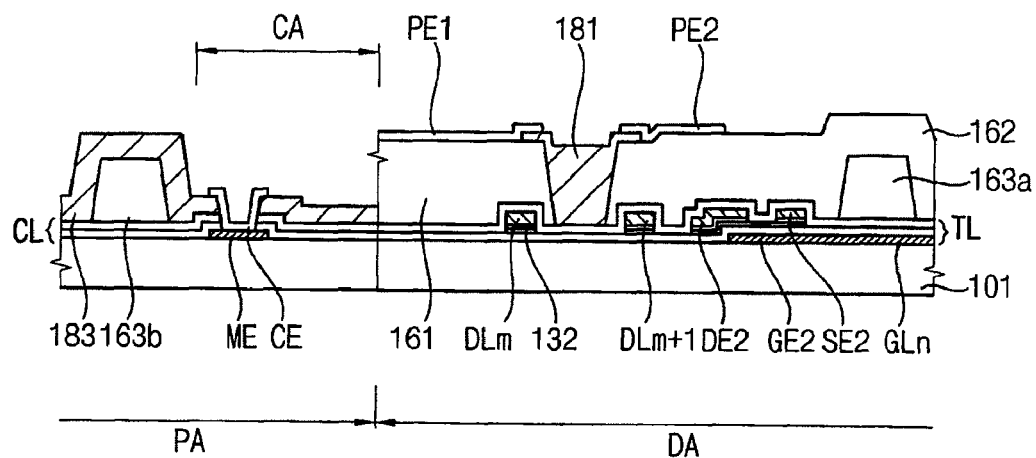
Figure 6C:
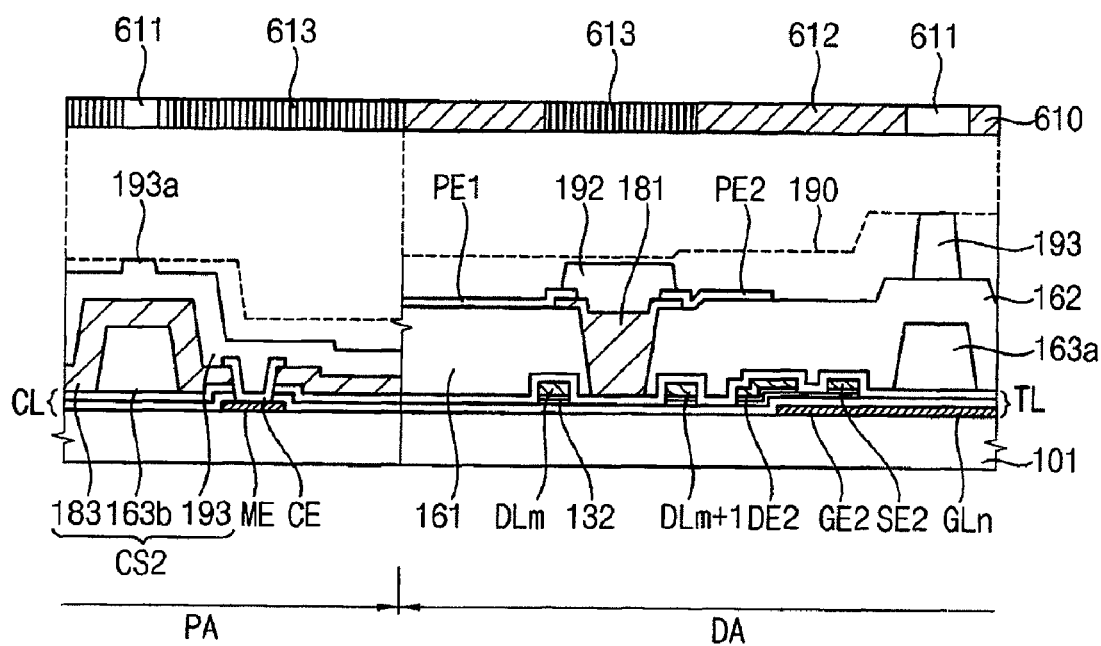

FIGS. 6A to 6C are cross-sectional views showing a method of manufacturing a display panel of FIG. 5.

Referring to FIGS. 2, 5 and 6A, the transistor layer TL is formed in the display area DA of the base substrate 101, and the circuit layer CL is formed in the peripheral area PA.

The first color pattern 163a is formed in the display area DA of the base substrate 101 where the transistor layer TL and the circuit layer CL are formed. The first color pattern 163a is formed by using a color photo-resist layer having a third color. The second color pattern 163b is formed in the peripheral area PA. The first color pattern 163a is formed to correspond to an area where the n-th gate line GLn is formed. In an exemplary embodiment, the first color pattern 163a is formed to correspond to an area where the gate metal pattern and the source metal pattern are formed.

The color filter 161 having the first color and the color filter 162 having the second color are formed in the first and second pixel areas, respectively. The color filter 162 is formed on the first color pattern 163a.

The first opening area H1 is formed in a boundary area between the pixel areas P1, P2 where the color filters 161, 162 are formed.

The color filters 161, 162 may include opening areas to expose the passivation layer 150 corresponding to the first and second contact holes C1, C2.

Referring to FIGS. 2, 5 and 6B, the first light blocking member 181 and the second light blocking member 183 are formed on the base substrate 101 where the color filters 161, 162, the first color pattern 163a and the second color pattern 163b are formed. The first light blocking member 181 is formed in the first opening area H1 of the display area DA.

The color filters 161, 162 may include opening areas to expose the passivation layer 150 corresponding to the first and second contact holes C1, C2.

Referring to FIGS. 2, 5 and 6B, the first light blocking member 181 and the second light blocking member 183 are formed on the base substrate 101 where the color filters 161, 162, the first color pattern 163a and the second color pattern 163b are formed. The first light blocking member 181 is formed in the first opening area H1 of the display area DA.

The second light blocking member 183 includes the second opening area H2 corresponding to an area where the metal pattern ME and the contact electrode CE are formed.

The pixel electrodes PE1, PE2 and the contact electrode CE are formed on the base substrate 101 where the first and second light blocking members 181, 183 are formed. The pixel electrodes PE1, PE2 are formed in the first and second areas P1, P2, respectively. The contact electrode CE is connected to the metal pattern of the circuit area CA through the second opening area H2.

Referring to FIGS. 2, 5 and 6C, the covering layer 190 is formed on the base substrate 101 where the pixel electrodes PE1, PE2 and the contact electrode CE are formed.

The covering layer 190 may include, for example, a transparent photo-sensitive material. Since the covering layer 190 is formed on the first color pattern 163a and the color filter 162, the covering layer 190 may have a thinner thickness due to a thickness of the first color pattern 163a and the color filter 162. In an exemplary embodiment, when the cell gap d is about 4 μm, a thickness of the first color pattern 163a t1 is about 3 μm and a thickness t2 of the color filter 162 overlapped with the first color pattern 163a is about 2 μm so that a thickness t3 of the transparent pattern 191 formed by the covering layer 190 is about 2-3 μm. When the spacing part CS1 is formed by the covering layer 190 without the first color pattern 163a, the thickness of the transparent pattern 191 is about 4 μm. In an exemplary embodiment, the thickness of the transparent pattern 191 is about 2-3 μm when the color pattern 163a is included.

The covering layer 190 is patterned by using a mask 610 including a transmissive portion 611, a light blocking portion 612 and a slit portion 613. The transmissive portion 611 corresponds to the first color pattern 163a, and the slit portion 613 corresponds to parts of the display and the peripheral areas DA, PA. The light blocking portion 612 corresponds to an area where the covering layer 190 is not formed. The transmissive portion 611 may further be formed in an area corresponding to the second color pattern 163b.

The covering layer 190 includes the first transparent member 192 formed on the first light blocking member 181 and the second transparent member 193 in the peripheral area PA. The second transparent member 193 may further include the protrusion 193a corresponding to the second color pattern 163b.

The first and second transparent members 192, 193 patterned by the slit portion 613 may have thinner thicknesses than the thickness of the transparent pattern 191 patterned by the transmissive portion 611. Thus, since a thickness of the first transparent member 192 is thinner, a spread property of the liquid crystal layer 300 can be improved.

Figure 7:
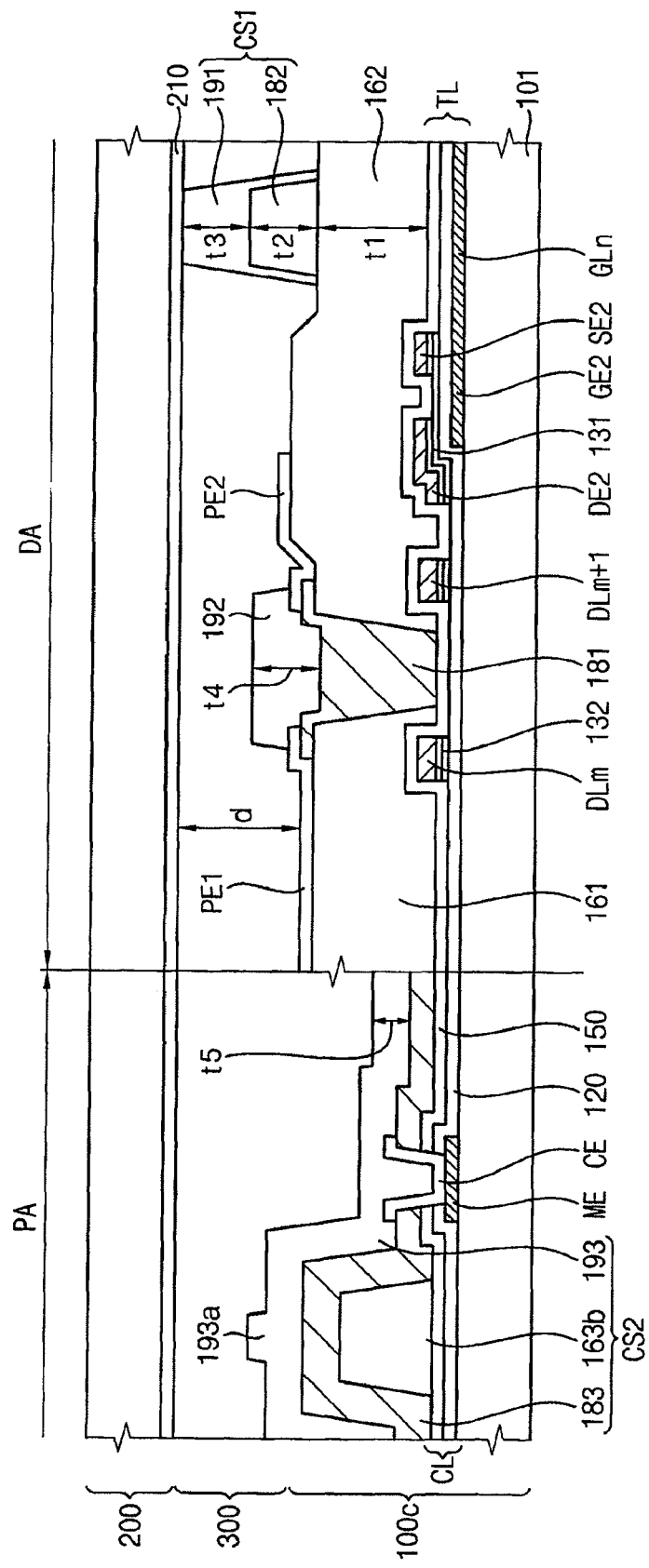
FIG. 7 is a cross-sectional view of a display panel according to an exemplary embodiment of the present invention.

FIG. 7 is a cross-sectional view of a display panel according to an exemplary embodiment of the present invention.

Referring to FIGS. 2 and 7, the display panel includes a display substrate 100c, the opposite substrate 200 and the liquid crystal layer 300.

The display substrate 100c includes the base substrate 101 having the display area DA and the peripheral area PA. The display area DA includes the transistor layer TL, the color filters 161, 162, the pixel electrodes PE1, PE2, the first light blocking member 181, the spacing part CS1 and the first transparent member 192. The peripheral area PA includes the circuit layer CL, the second color pattern 163b, the second light blocking member 183, the contact electrode CE and the second transparent member 193.

The spacing part CS1 includes a light blocking pattern 182 and the transparent pattern 191.

The light blocking pattern 182 is formed on the color filter 162 corresponding to the n-th gate line GLn. In an exemplary embodiment, the light blocking pattern 182 is formed on the color filter 162 corresponding to the gate metal pattern and the source metal pattern. The light blocking pattern 182 may include substantially the same material as the first and second light blocking members 181, 183. The light blocking pattern 182 may be manufactured using the same process used in manufacturing the first and second light blocking members 181, 183.

The transparent pattern 191 may include substantially the same material as the first and second transparent members 192, 193. The transparent pattern 191 is formed on the light blocking pattern 182. An end portion of the transparent pattern 191 is in contact with a surface of the opposite substrate 200 and forms the cell gap d of the liquid crystal layer 300.

The cell gap d includes a thickness of the light blocking member 182 and a thickness of the transparent pattern 191. In an exemplary embodiment, when the cell gap d is about 4 μm, the thickness t1 of the color filter 162 is about 3 μm, the thickness of the light blocking pattern t2 182 is about 2 μm and the thickness t3 of the transparent pattern 191 is about 2 μm.

The thickness of the first transparent member 192 and the thickness of the second transparent member 193 are thinner than the thickness of the transparent pattern 191. When the thickness of the transparent pattern 191 is about 2 μm, the thickness of the first transparent member 192 is not more than about 2 μm.

Since the thickness of the first transparent member 192 is thinner, a spread property of the liquid crystal layer 300 can be improved. When the light blocking pattern 182 includes a material having a higher optical density, the thickness of the first transparent member 192 formed on the first light blocking pattern 181 can be reduced.

Figure 8A:
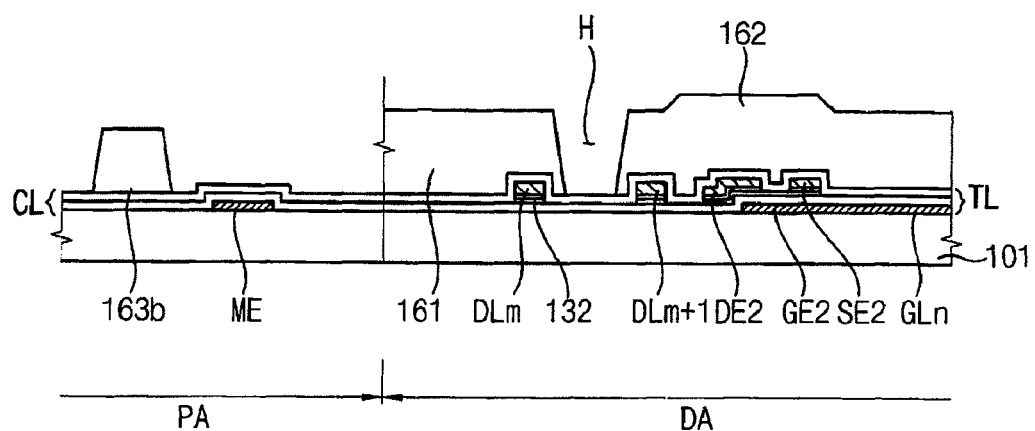
FIGS. 8A to 8C are cross-sectional views showing a method of manufacturing a display panel of FIG. 7.
Figure 8B:
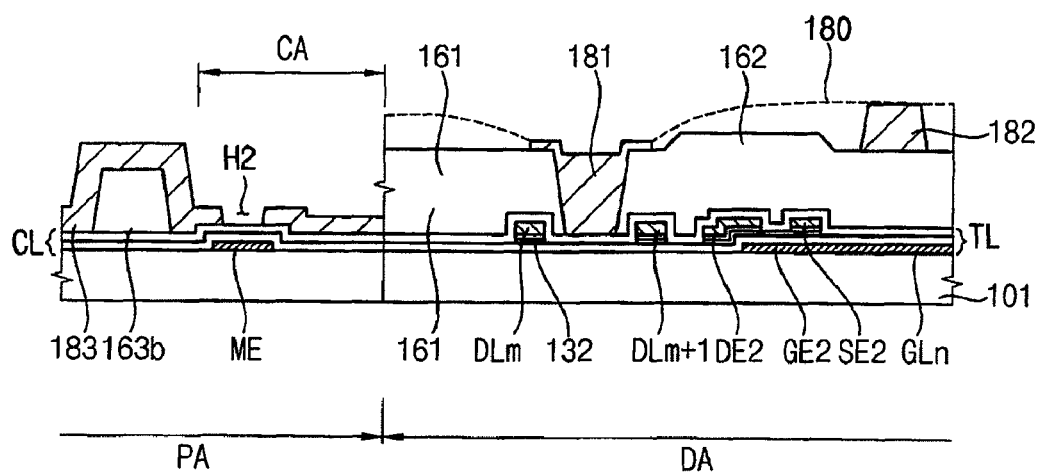
Figure 8C:
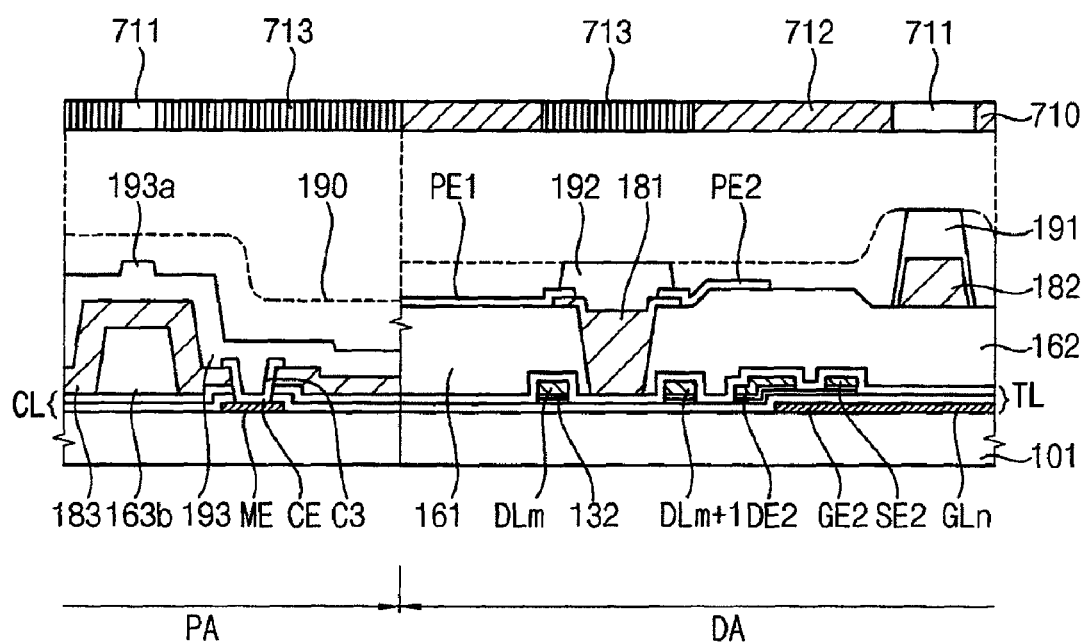

FIGS. 8A to 8C are cross-sectional views showing a method of manufacturing a display panel of FIG. 7.

Referring to FIGS. 2, 7 and 8A, the transistor layer TL is formed in the display area DA of the base substrate 101 and the circuit layer CL is formed in the peripheral area PA.

The color filters 161, 162 are formed on the transistor layer TL of the display area DA. The color pattern 163b is formed on the circuit layer CL of the peripheral area PA. The first opening area H1 is formed in a boundary area of the color filters 161, 162. The color filters 161, 162 may include opening areas to expose the passivation layer 150 corresponding to the first and second contact holes C1, C2.

Referring to FIGS. 2, 7 and 8B, the light blocking layer 180 is formed on the base substrate 101 where the color filters 161, 162 and the color pattern 163b are formed. The first light blocking member 181 of the display area DA and the second light blocking pattern 182 are formed by patterning the light blocking layer 180. The first light blocking member 181 is formed in the first opening area H1. The light blocking pattern 182 is formed on the color filter 162.

The second light blocking member 183 is formed in the peripheral area PA, and the second opening area H2 is formed in an area corresponding to the metal pattern ME of the circuit area CA.

Referring to FIGS. 2, 7 and 8C, the covering layer 190 is formed on the base substrate 101 where the light blocking pattern 182, the first light blocking member 181 and the second light blocking member 183 are formed.

The covering layer 190 includes a transparent photo-sensitive material. The covering layer 190 may have a thinner thickness due to the thickness of the light blocking pattern 182. In an exemplary embodiment, when the cell gap d is about 4 μm, a thickness t1 of the color filter 162 is about 3 μm and a thickness t2 of the light blocking pattern 182 formed on the color filter 162 is about 2 μm, so that a thickness t3 of the transparent pattern 191 formed by the covering layer 190 is about 2 μm. When the spacing part CS1 is formed by the covering layer 190 without the light blocking pattern 182, the thickness of the transparent pattern 191 is about 4 μm. In an exemplary embodiment, the thickness of the transparent pattern 191 is about 2 μm when formed on the light blocking pattern 182.

The covering layer 190 is patterned by using a mask 710 including a transmissive portion 711, a light blocking portion 712 and a slit portion 713. The transmissive portion 711 corresponds to the light blocking pattern 182, and the slit portion 713 corresponds to parts of the display and the peripheral areas DA, PA. The light blocking portion 712 corresponds to an area where the covering layer 190 is not formed. The transmissive portion 711 may further be formed in an area corresponding to the second color pattern 163b.

The covering layer 190 includes the transparent pattern 191 formed on the first light blocking member 182, the first transparent member 192 formed on the first light blocking member 181, and the second transparent member 193 having the protrusion 193a in the peripheral area PA.

The first and second transparent members 192, 193 patterned by the slit portion 713 may have thinner thicknesses than the thickness of the transparent pattern 191 patterned by the transmissive portion 711. Thus, since a thickness of the first transparent member 192 is thinner, a spread property of the liquid crystal layer 300 can be improved.

Figure 9:
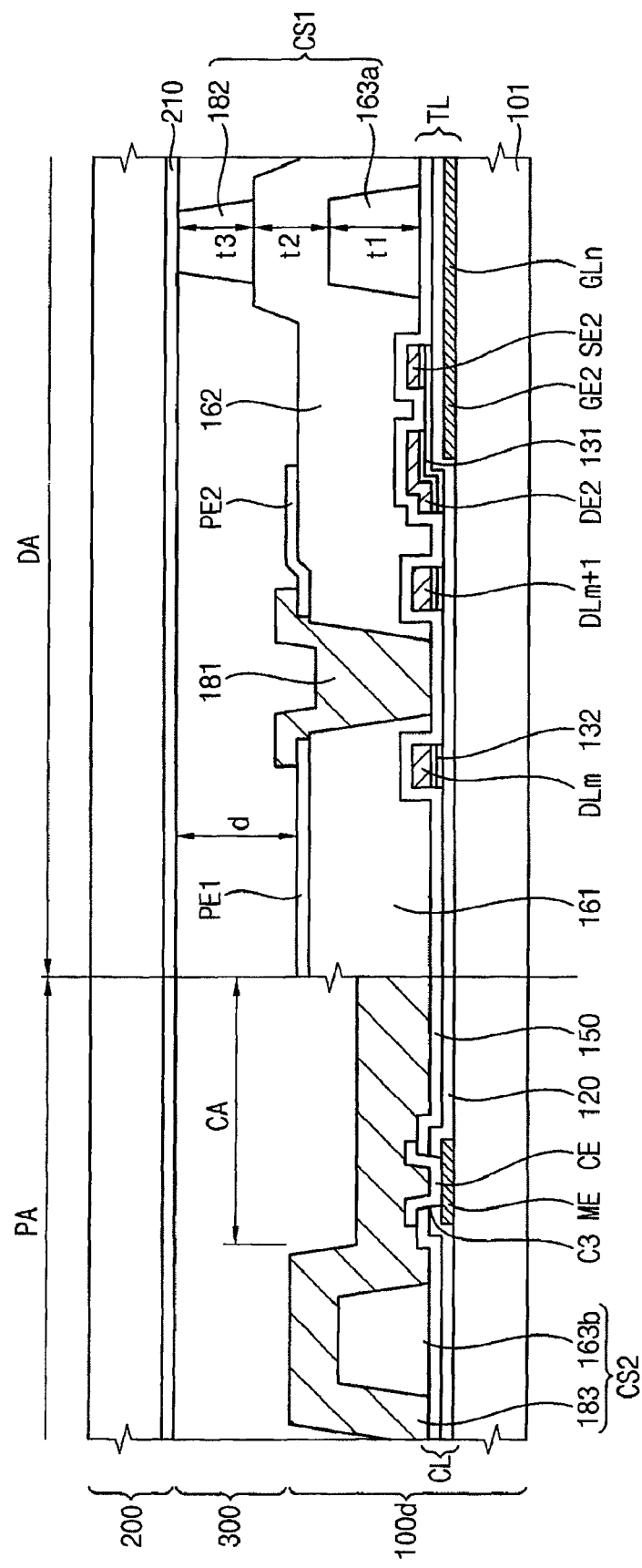
FIG. 9 is a cross-sectional view of a display panel according to an exemplary embodiment of the present invention.

FIG. 9 is a cross-sectional view of a display panel according to an exemplary embodiment of the present invention.

Referring to FIGS. 2 and 9, the display panel includes a display substrate 100d, the opposite substrate 200 and the liquid crystal layer 300.

The display substrate 100d includes the base substrate 101 having the display area DA and the peripheral area PA. The display area DA includes the transistor layer TL, the color filters 161, 162, the pixel electrodes PE1, PE2, the first light blocking member 181, and the spacing part CS1. The peripheral area PA includes the circuit layer CL, the second color pattern 163b, the contact electrode CE and the second light blocking member 183. The protrusion part (CS2) including the second color pattern 163b and the second light blocking member 183 is formed in the peripheral area PA.

The spacing part CS1 includes the first color pattern 163a and the light blocking pattern 182. The first color pattern 163a is formed on the transistor layer TL corresponding to the n-th gate line GLn. In an exemplary embodiment, the first color pattern 163a is formed on the transistor layer TL corresponding to the gate metal pattern and the source metal pattern. The first color pattern 163a includes a different color from the color filter 162.

The light blocking pattern 182 includes substantially the same material as the first and second light blocking members 181, 183. The light blocking pattern 182 is formed on the color filter 162 corresponding to where the first color pattern 163a is formed. An end portion of the light blocking pattern 182 is in contact with the opposite substrate 200 and maintains the cell gap d of the liquid crystal layer 300.

The cell gap d includes part of a thickness t2 of the color filter 162 and a thickness t3 of the light blocking pattern 182. In an exemplary embodiment, when the cell gap d is about 4 µm, the thickness t1 of the first color pattern 163a is about 3 µm, the thickness t2 of the color filter 162 formed on the first color pattern 163a is about 2 µm and the thickness t3 of the light blocking pattern 182 is about 2-3 µm.

The second light blocking member 183 is formed in the peripheral area PA where the second color pattern 163b and the contact electrode CE of the circuit area CA are formed. The second light blocking member 183 is in contact with the contact electrode CE. Since the second light blocking member 183 covers the metal pattern ME of the circuit area CA and the contact electrode CE, light leakage that is reflected by the metal pattern ME and the contact electrode CE can be prevented.

Figure 10A:
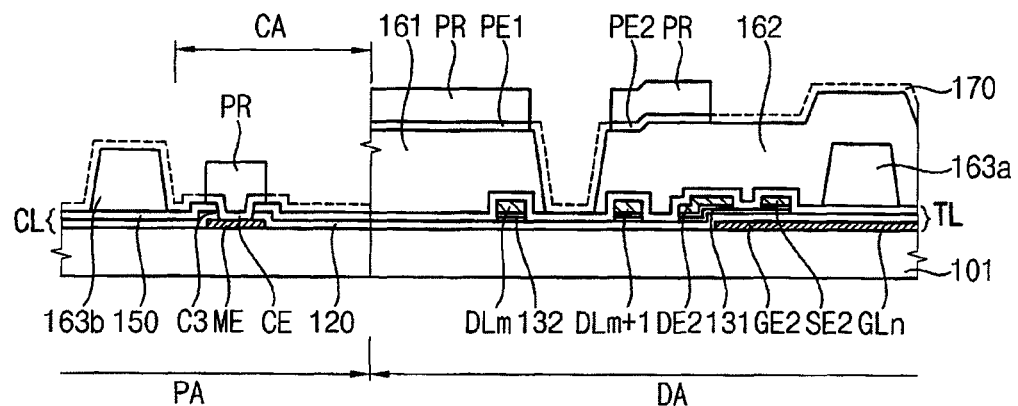
FIGS. 10A to 10B are cross-sectional views showing a method of manufacturing a display panel of FIG. 9.
Figure 10B:
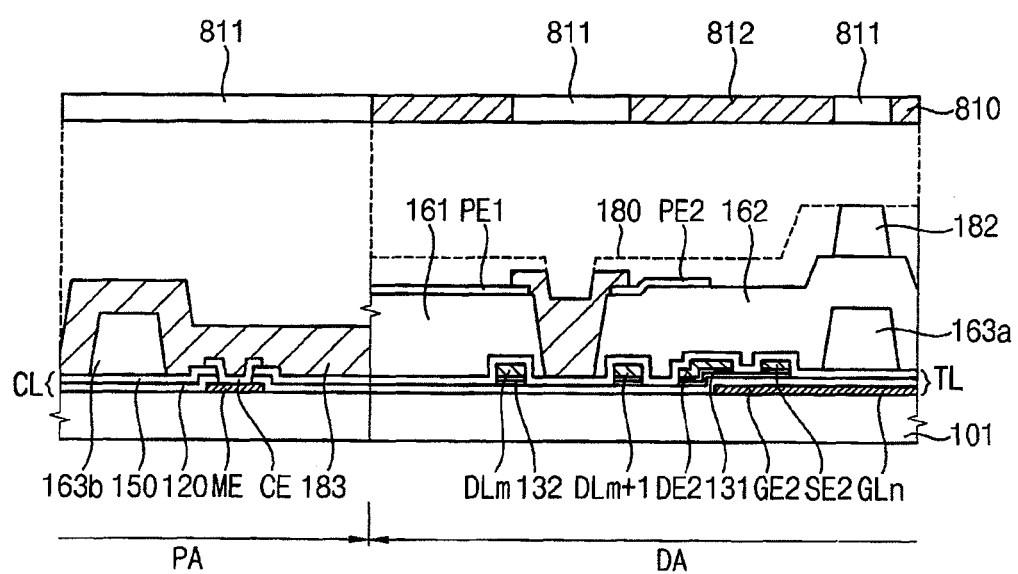

FIGS. 10A to 10C are cross-sectional views showing a method of manufacturing a display panel of FIG. 9.

Referring to FIGS. 2, 9 and 10A, the transistor layer TL is formed in the display area DA of the base substrate 101, and the circuit layer CL is formed in the peripheral area PA.

The first color pattern 163a of the display area DA and the second color pattern 163b of the peripheral area PA are formed by using a color photo-resist layer having a third color. The first color pattern 163a is formed in an area corresponding to the n-th gate line GLn. In an exemplary embodiment, the first color pattern 163a is formed in an area corresponding to the gate metal pattern and the source metal pattern.

The color filters 161, 162 having first and second colors are formed in the first pixel area and the second pixel area, respectively. The color filter 162 is formed on the first color pattern 163a.

The first opening area H1 is formed in a boundary area between the pixel areas P1, P2 where the color filters 161, 162 are formed.

The color filters 161, 162 may include opening areas to expose the passivation layer 150 corresponding to the first and second contact holes C1, C2.

The first contact hole, the second contact hole and a third contact hole to expose the drain electrodes DE1, DE2 and the metal pattern ME are formed by etching the base substrate 101 where the first and second color patterns 163a, 163b and the color filters 161, 162 are formed.

The transparent conductive layer 170 is formed on the base substrate 101 where the first, second and third contact holes C1, C2, C3 are formed. A negative type photo-resist pattern PR is formed on the base substrate 101 where the transparent conductive layer 170 is formed. The pixel electrodes PE1, PE2 of the display area DA and the contact electrode CE of the circuit area CA of the peripheral area PA are formed by patterning the transparent conductive layer 170.

Referring to FIGS. 2, 9 and 10B, the light blocking layer 180 is formed on the base substrate 101 where the pixel electrodes PE1, PE2 and the contact electrode CE are formed. A mask 810 including a transmissive portion 811 and light blocking portion 812 is disposed on the base substrate 101 where the light blocking layer 180 is formed.

The transmissive portion 811 corresponds to an area where the light blocking layer 180 remains. In an exemplary embodiment, the transmissive portion 811 corresponds to the light blocking pattern 182, the first light blocking member 181 and the second light blocking member 183.

The light blocking layer 180 is patterned by the mask 810 so that the first light blocking member 181 and the light blocking pattern 182 of the display area DA and the second light blocking member 183 of the peripheral area PA are formed.

In an exemplary embodiment, when the cell gap d is about 4 µm, a thickness t1 of the first color pattern 163a is about 3 µm and a thickness t2 of the color filter 162 overlapped with the first color pattern 163a is about 2 µm so that a thickness of the light blocking pattern 182 is about 2-3 µm.

According to an exemplary embodiment, since an additional transparent member is not formed on the first light blocking member 181, a spread property of the liquid crystal layer 300 can be improved.

Figure 11:
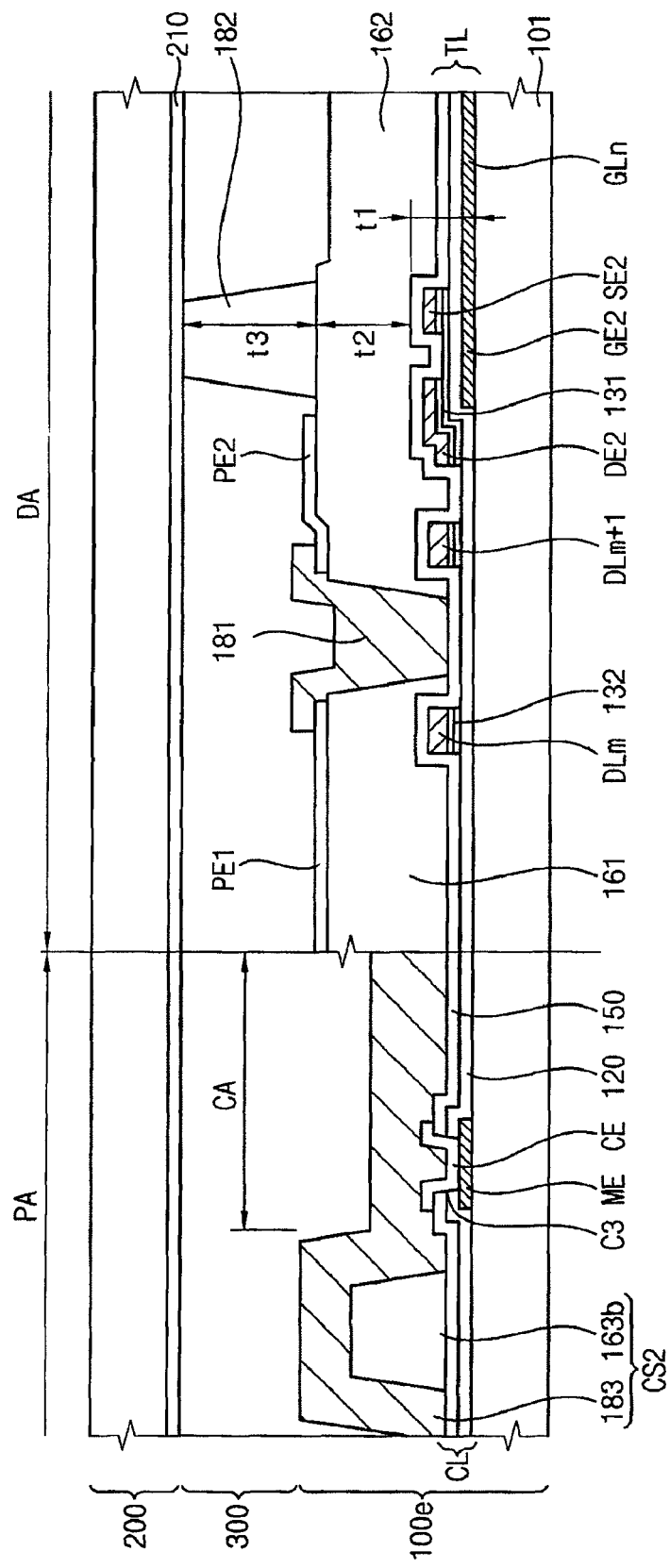
FIG. 11 is a cross-sectional view of a display panel according to an exemplary embodiment of the present invention.

FIG. 11 is a cross-sectional view of a display panel according to an exemplary embodiment of the present invention.

Referring to FIGS. 2 and 11, the display panel includes a display substrate 100e, the opposite substrate 200 and the liquid crystal layer 300.

The display substrate 100e includes the base substrate 101 having the display area DA and the peripheral area PA. The display area DA includes the transistor layer TL, the color filters 161, 162, the pixel electrodes PE1, PE2, the first light blocking member 181 and the light blocking pattern 182. The peripheral area PA includes the circuit layer CL, the second color pattern 163b, the contact electrode CE and the second light blocking member 183. The protrusion part CS2 including the second color pattern 163b and the second light blocking member 183 is formed in the peripheral area PA.

The light blocking pattern 182 is formed on the color filter 162 and corresponds to an area where the gate metal pattern is overlapped with the source metal pattern. In an exemplary embodiment, the light blocking pattern is disposed in an area where the n-th gate line GLn crosses the data lines DLm−2, DLm−1, DLm, DLm+1, DLm+2, or the first and second transistors TR1, TR2 are formed.

The cell gap d includes a part of the thickness t2 of the color filter 162 and a thickness t3 of the light blocking pattern 182. In an exemplary embodiment, when the cell gap d is about 4 µm, the thickness t1 of the gate and source metal pattern is about 3 µm and the thickness t2 of the color filter 162 is about 3 µm, and the thickness t3 of the light blocking pattern 182 is about 3 µm.

Figure 12:
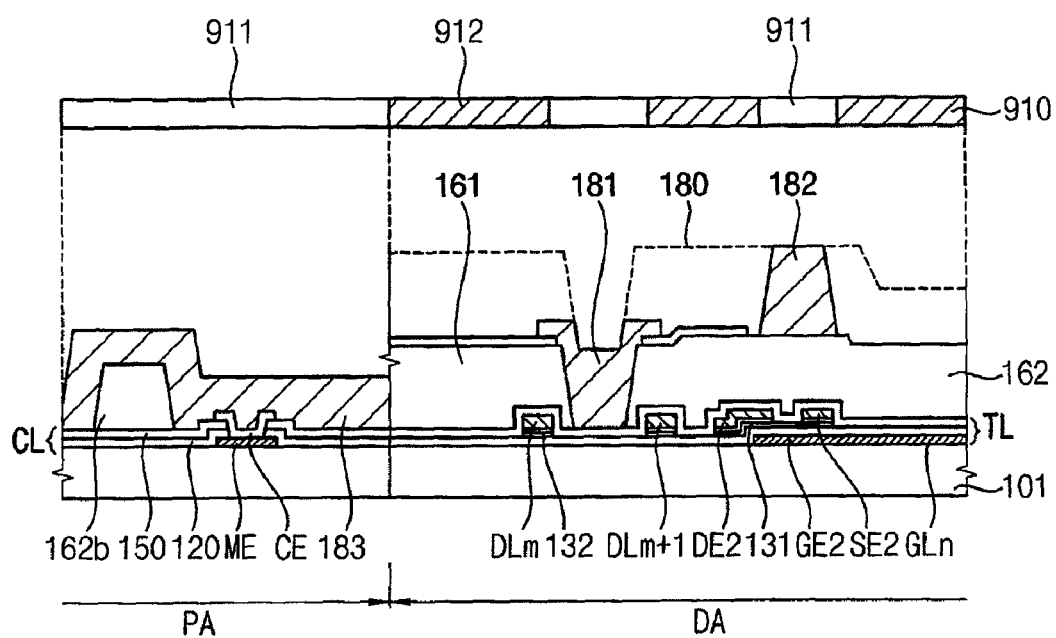
FIG. 12 is a cross-sectional view showing a method of manufacturing a display panel of FIG. 11.

FIG. 12 is a cross-sectional view showing a method of manufacturing a display panel of FIG. 11.

Referring to FIGS. 2, 11 and 12, the transistor layer TL is formed in the display area DA of the base substrate 101, and the circuit layer CL is formed in the peripheral area PA. The color filters 161, 162 are formed on the transistor layer TL. The color pattern 163b is formed on the circuit layer CL.

The first, second and third contact holes C1, C2, C3 to expose the drain electrodes DE1, DE2 and the metal pattern ME are formed by etching the base substrate 101 where the color pattern 163b and the color filters 161, 162 are formed. The pixel electrodes PE1, PE2 and the contact electrode CE are formed on the base substrate 101 where the first, second, third contact holes C1, C2, C3 are formed.

The light blocking layer 180 is formed on the base substrate 101 having the pixel electrodes PE1, PE2 and the contact electrode CE. A mask 910 including a transmissive portion 911 and a light blocking portion 912 is disposed on the base substrate where the light blocking layer 180 is formed.

The transmissive portion 911 corresponds to an area where the light blocking layer 180 remains. In an exemplary embodiment, the transmissive portion 911 corresponds to the light blocking pattern 182, the first light blocking member 181 and the second light blocking member 183.

The light blocking layer 180 is patterned by the mask 910 so that the first light blocking member 181 and the light blocking pattern 182 of the display area DA and the second light blocking member 183 of the peripheral area PA are formed.

In an exemplary embodiment, when the cell gap d is about 4 μm, a thickness of the gate and source metal pattern is about 1 μm and a thickness of the color filter 162 is about 3 μm so that a thickness of the light blocking pattern 182 is about 3 μm.

According to an exemplary embodiment, since an additional transparent member is not formed on the first light blocking member 181, a spread property of the liquid crystal layer 300 can be improved.

Figure 13:
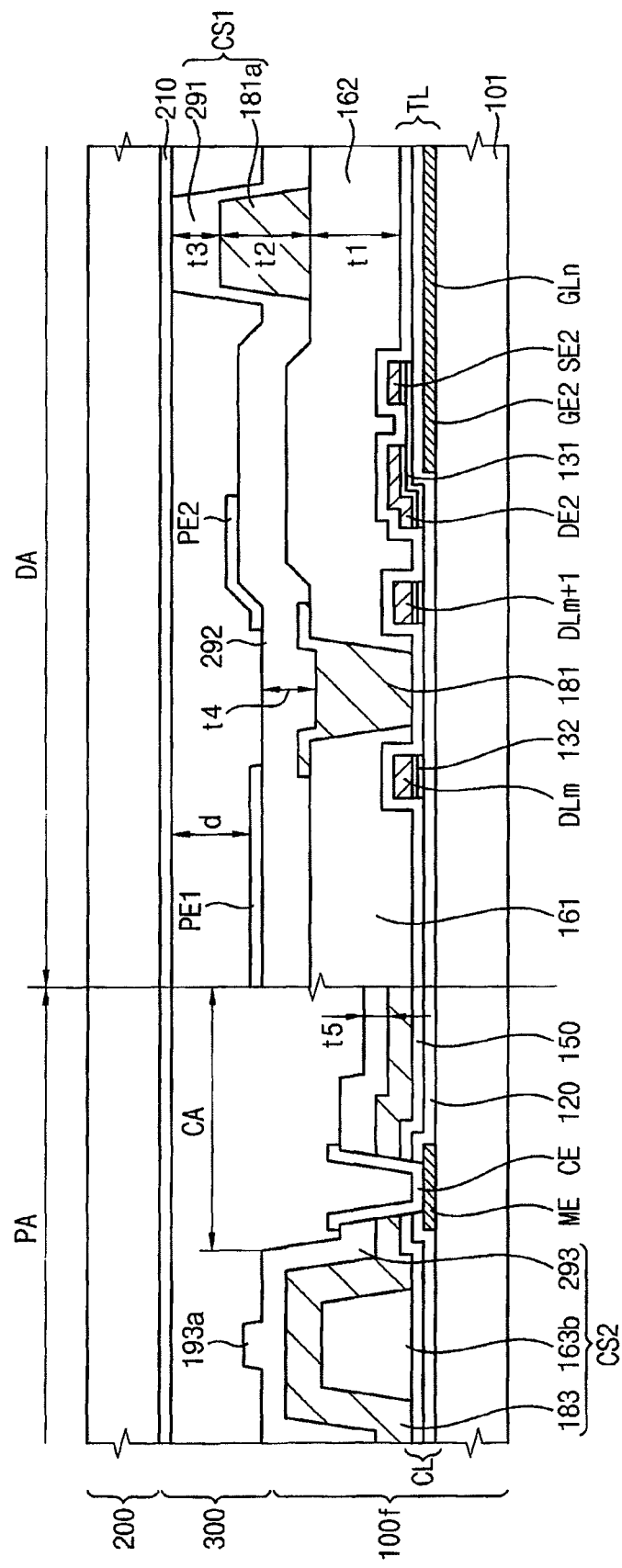
FIG. 13 is a cross-sectional view of a display panel in accordance with an exemplary embodiment of the present invention.

FIG. 13 is a cross-sectional view of a display panel in accordance with an exemplary embodiment of the present invention. The display panel of the present embodiment is substantially the same as the display panel of FIGS. 1 to 4E except with respect to, for example, a spacing part, a transparent member, a pixel electrode and a contact electrode. Thus, any repetitive explanation concerning the above element will be omitted.

Referring to FIG. 13, the display panel includes the display substrate 100f, the opposite substrate 200 and a liquid crystal layer 300.

Color filters 161 and 162 are formed in pixel areas P1 and P2 of a first base substrate 101 where a transistor layer TL is formed.

A first light blocking member 181 is formed in a first opening area H1. The first light blocking member 181 divides the pixel areas P1 and P2 where the color filters 161 and 162 are formed.

The spacing part CS1 maintains a cell gap d between the display substrate 100a and the opposite substrate 200. The spacing part CS1 is formed on the color filter 162 corresponding to the n-th gate line GLn. The spacing part CS1 can be disposed in an area corresponding to the gate metal pattern or the source metal pattern.

The spacing part CS1 includes a transparent pattern 291 and a spacing blocking pattern 181a instead of the first color pattern 163a (shown in FIG. 3). The spacing blocking member 181a is formed on the color filter 162, and the transparent pattern 291 is formed on the spacing blocking pattern 181a.

A first transparent member 292 is formed on the first light blocking member 181 to cover the first light blocking member 181 and the color filters 161 and 162. The first transparent member 292 is formed from the same layer as the transparent pattern 291. A fourth thickness t4 of the first transparent member 292 is thinner than the third thickness t3 of the transparent pattern 291. The first transparent member 292 is formed on the first light blocking member 181 and the color filters 161 and 162 to prevent the first light blocking member 181 and the color filters 161 and 162 from being exposed. Thus, an afterimage that may occur by gas generated from the first light blocking member 181 can be prevented.

In FIG. 13, the first transparent member 292 is extended towards the color filters 161 and 162 to prevent the color filters 161 and 162 from being exposed to a liquid crystal layer 300. Thus, impurities from the color filters 161 and 162 are blocked by the first transparent member 292 to protect the liquid crystal layer 300.

The second transparent member 293 is formed on the second light blocking member 183 of the peripheral area PA. A contact electrode CE is electrically connected to a metal pattern ME through a second contact hole H2 that is formed through the second transparent member 293, the second light blocking member 183, the passivation layer 150 and the gate insulating layer 120.

Pixel electrodes PE1 and PE2 are formed on the first transparent member 292 in pixel regions P1 and P2.

Figure 14A:
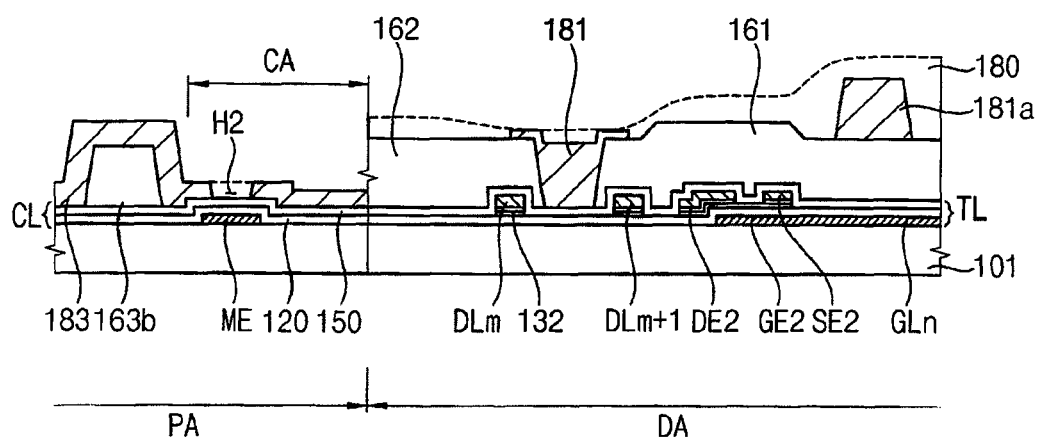
FIGS. 14A to 14C are cross-sectional views showing a method of manufacturing the display panel of FIG. 13.
Figure 14B:
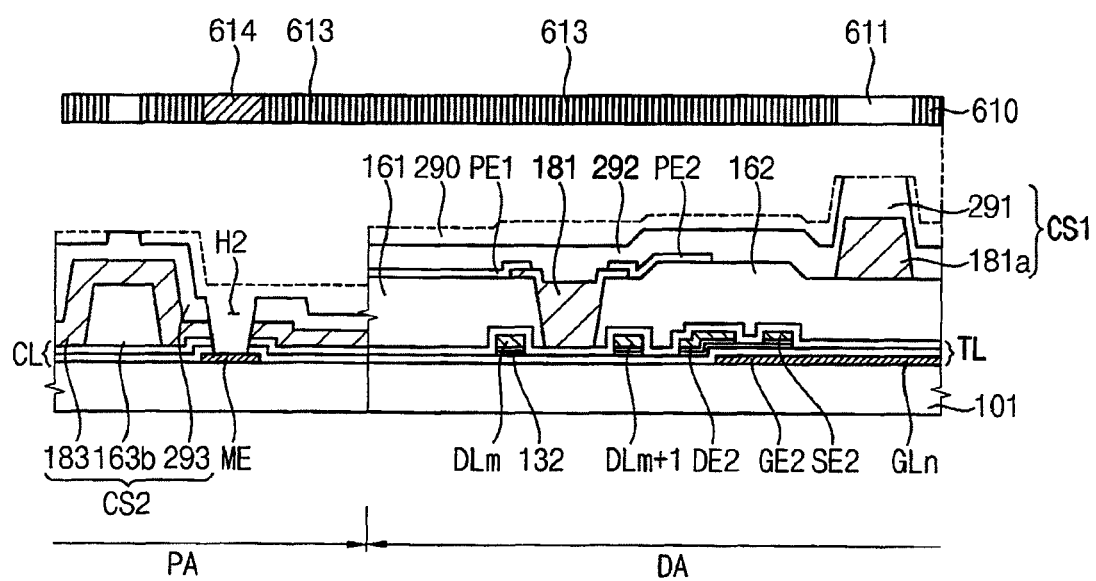
Figure 14C:
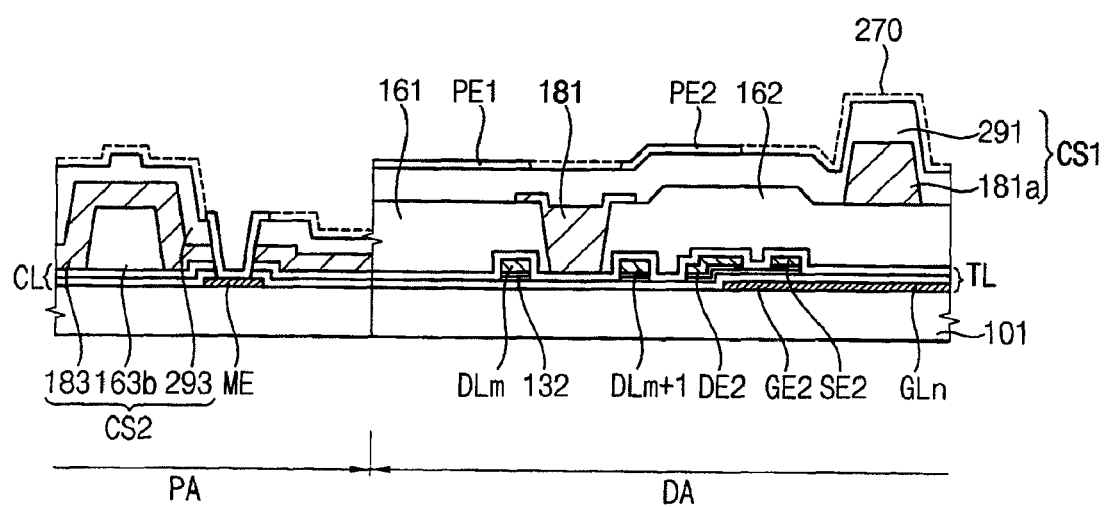

FIGS. 14A to 14C are cross-sectional views showing a method of manufacturing the display panel of FIG. 13. FIG. 14A is a cross-sectional view illustrating forming the first light blocking member, the second light blocking member and the spacing blocking pattern shown in FIG. 13.

Referring to FIGS. 13 and 14A, a gate metal pattern, the gate insulating layer 120, a source metal pattern, the passivation layer 150 and the color filters 161 and 162 are formed on the base substrate 101. In FIGS. 13 and 14A, the first color pattern 163a (shown in FIG. 4C) is omitted.

A light blocking layer 180 is formed on the base substrate 101 where the color filters 161 and 162 and the second color pattern 163b are formed. The first light blocking member 181 and the spacing blocking pattern 181a are formed in the display area DA, and the second light blocking member 183 is formed in the peripheral area PA by patterning the light blocking layer 180. The first light blocking member 181 is formed in the first contact hole H1 in the display area DA, and the spacing blocking pattern 181a is formed on the color filter 162.

FIG. 14B is a cross-sectional view illustrating a transparent pattern and a first transparent member on the substrate shown in FIG. 14A.

Referring to FIGS. 13 and 14B, a covering layer 290 is formed on the base substrate 101 where the first and second light blocking members 181 and 182 and the spacing blocking pattern 181a are formed.

The covering layer 290 is patterned by using a mask 610 including a transmissive portion 611, a light blocking portion 614 and a slit portion 613. The transmissive portion 611 corresponds to the spacing blocking pattern 181a, and the light blocking portion 614 corresponds to the second contact hole H2. The slit portion 613 corresponds to a remainder of the base substrate 101. Thus, the transparent pattern 291 and the first transparent member 292 are formed.

FIG. 14C is a cross-sectional view illustrating forming a pixel electrode and a contact electrode on the substrate shown in FIG. 14B.

Referring to FIGS. 13 and 14C, a transparent conductive layer 270 is formed on the base substrate 101 where the transparent pattern 291 and the first transparent member 292 are formed. The transparent conductive layer 270 is patterned so that the pixel electrodes PE1 and PE2 are formed in the display area DA and the contact electrode CE is formed in the peripheral area PA.

Although the illustrative embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. An array substrate comprising:
a substrate including a display area and a peripheral area surrounding the display area;
a transistor layer formed in the display area of the substrate and electrically connected to a gate line and a data line;
a first color filter and a second color filter formed in a pixel region on the transistor layer;
a first light blocking member disposed between the first color filter and the second color filter;
a first transparent member formed on the first light blocking member, wherein the first transparent member is distinct from a pixel electrode;
a first color pattern formed in a peripheral area of the substrate and including substantially the same material as the first and second color filters; and
a second transparent member including substantially the same material as the first transparent member, wherein the second transparent member is disposed in the peripheral area of the substrate on the first color pattern.

2. The array substrate of claim 1, wherein the first transparent member is extended towards an upper surface of the first and second color filters to cover part of the upper surface of the first and second color filters.

3. The array substrate of claim 1, further comprising a spacing part maintaining a gap between the substrate and an opposite substrate, wherein the spacing part comprises a greater thickness than each of the first and second transparent members.

4. The array substrate of claim 3, wherein the spacing part further comprises substantially the same material as the first and second color filters.

5. The array substrate of claim 3, further comprising a second color pattern including substantially the same material as the first and second color filters, wherein the second color pattern is disposed between the substrate and the second color filter.

6. The array substrate of claim 3, wherein the spacing part comprises a light blocking pattern including substantially the same material as the first light blocking member, and the light blocking pattern is disposed between the second color filter and a transparent pattern.

7. The array substrate of claim 1, further comprising a circuit layer formed in the peripheral area, wherein the circuit layer comprises a metal pattern of a circuit part.

8. The array substrate of claim 7, further comprising a second light blocking member disposed between the first color pattern and the second transparent member, wherein the second light blocking member comprises an opening area corresponding to the metal pattern, and
a contact electrode of the circuit part is in contact with the metal pattern through the opening area, wherein the contact electrode is in contact with the second transparent member.

9. The array substrate of claim 8, wherein the circuit part comprises a gate driving circuit applying a driving signal to the gate line.

10. An array substrate comprising:
a substrate including a display area and a peripheral area surrounding the display area;
a transistor layer formed in the display area of the substrate and electrically connected to a gate line and a data line;
a color filter formed in a pixel region on the transistor layer;
a first light blocking member disposed between adjacent color filters;
a transparent member formed on the first light blocking member, wherein the transparent member is distinct from a pixel electrode;
a spacing part maintaining a gap between the substrate and an opposite substrate, wherein the spacing part comprises a light blocking pattern including substantially the same material as the first light blocking member and a first color pattern including substantially the same material as the color filter;
a second color pattern including substantially the same material as the color filter, wherein the second color pattern is formed in the peripheral area of the substrate;
a circuit part including a metal pattern formed in the peripheral area and a contact electrode contacting the metal pattern; and
a second light blocking member formed on the second color pattern.

11. An array substrate comprising:
a substrate including a display area and a peripheral area surrounding the display area;
a transistor layer formed in the display area of the substrate, wherein the transistor layer comprises a gate metal pattern and a data metal pattern;
a color filter formed in a pixel region on the transistor layer;
a first light blocking member disposed between adjacent color filters, wherein the first light blocking member overlaps adjacent data lines on either side of the first light blocking member;
a spacing part maintaining a gap between the substrate and an opposite substrate, wherein the spacing part comprises substantially the same material as the color filter and the spacing part is disposed in an area where the gate metal pattern is overlapped with the data metal pattern;
a color pattern including substantially the same material as the color filter, wherein the color pattern is formed in the peripheral area of the substrate;
a circuit part including a metal pattern formed in the peripheral area and a contact electrode contacting the metal pattern; and
a second light blocking member formed on the color pattern.

12. A method of manufacturing an array substrate, the method comprising:
forming a substrate including a display area and a peripheral area surrounding the display area;
forming a transistor layer in the display area of the substrate and a circuit layer including a metal pattern of a circuit part in the peripheral area of the substrate;
forming a first color filter and a second color filter on the transistor layer and a first color pattern on the circuit layer;
forming a first light blocking member between the first color filter and the second color filter;
forming a second light blocking member in the peripheral area to cover the first color pattern;
forming a pixel electrode on each of the first and second color filters and a contact electrode contacting the metal pattern; and forming a first transparent member and a second transparent member on the substrate having the pixel electrodes and the contact electrode, wherein the first transparent member is distinct from the pixel electrodes.

13. The method of claim 12, wherein forming the second transparent member further comprises forming a transparent pattern having a greater thickness than the second transparent member.

14. The method of claim 12, wherein forming the first color pattern further comprises forming a second color pattern on the color filter.

15. The method of claim 14, wherein forming the second transparent member further comprises forming a transparent pattern on the second color pattern, wherein the transparent pattern comprises a greater thickness than the second transparent member.

16. The method of claim 12, wherein forming the second light blocking member further comprises forming a light blocking pattern on the color filter.

17. The method of claim 16, wherein forming the second transparent member further comprises forming a transparent pattern having a greater thickness than the second transparent member.

18. A method of manufacturing an array substrate, the method comprising:
   forming a substrate including a display area and a peripheral area surrounding the display area;
   forming a transistor layer in the display area of the substrate and a circuit layer including a metal pattern of a circuit part in the peripheral area of the substrate;
   forming a first color filter and a second color filter on the transistor layer and a first color pattern on the circuit layer;
   forming a first light blocking member between the first color filter and the second color filter;
   forming a second light blocking member in the peripheral area to cover the first color pattern;
   forming a first transparent member and a second transparent member on the substrate having the first and second light blocking members; and
   forming a pixel electrode on the first transparent member and a contact electrode on the second transparent member, the contact electrode contacting the metal pattern, wherein the first transparent member is distinct from the pixel electrode.

19. The method of claim 18, wherein the first transparent member is extended to an upper surface of the first and second color filters.

20. A method of manufacturing an array substrate, the method comprising:
   forming a substrate including a display area and a peripheral area surrounding the display area;
   forming a transistor layer in the display area of the substrate and a circuit layer including a metal pattern of a circuit part in the peripheral area of the substrate;
   forming a first color filter and a second color filter on the transistor layer and a color pattern on the circuit layer;
   forming a pixel electrode on each of the first color filter and the second color filter;
   forming a contact electrode contacting the metal pattern; and
   forming a first light blocking member between the first color filter and the second color filter, wherein the first light blocking member overlaps adjacent data lines on either side of the first light blocking member;
   forming a light blocking pattern on the color filter corresponding to a region where a gate metal pattern is overlapped with a data metal pattern, and a second light blocking member in the peripheral area to cover the color pattern.

* * * * *